United States Patent
Cho et al.

(10) Patent No.: US 12,236,105 B2
(45) Date of Patent: Feb. 25, 2025

(54) SEMICONDUCTOR MEMORY DEVICES HAVING ENHANCED REFRESH OPERATIONS THAT INHIBIT ROW HAMMER HACKING

(71) Applicant: Samsung Electronics Co., Ltd., Suwon-si (KR)

(72) Inventors: Seong-Jin Cho, Hwaseong-si (KR); Jung Min You, Hwaseong-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 153 days.

(21) Appl. No.: 17/934,623

(22) Filed: Sep. 23, 2022

(65) Prior Publication Data
US 2023/0221869 A1     Jul. 13, 2023

(30) Foreign Application Priority Data

Jan. 11, 2022 (KR) .................. 10-2022-0004000
Apr. 26, 2022 (KR) .................. 10-2022-0051267

(51) Int. Cl.
    *G06F 3/06*         (2006.01)

(52) U.S. Cl.
    CPC .......... *G06F 3/0619* (2013.01); *G06F 3/0653* (2013.01); *G06F 3/0679* (2013.01)

(58) Field of Classification Search
CPC .... G06F 3/0619; G06F 3/0653; G06F 3/0679; G11C 11/40615; G11C 11/40622; G11C 11/4087; G11C 11/4078; G11C 11/401; G11C 11/34; G11C 11/406
See application file for complete search history.

(56) References Cited

U.S. PATENT DOCUMENTS

| | | | |
|---|---|---|---|
| 9,032,141 B2 | 5/2015 | Bains et al. | |
| 9,299,400 B2 | 3/2016 | Bains et al. | |
| 9,589,606 B2 | 3/2017 | Lin et al. | |
| 10,490,250 B1* | 11/2019 | Ito | G11C 11/4087 |
| 10,770,127 B2 | 9/2020 | Shore et al. | |
| 10,860,222 B2 | 12/2020 | Shin et al. | |
| 10,950,288 B2 | 3/2021 | Nale et al. | |
| 11,049,545 B2 | 6/2021 | Lee | |
| 2020/0135263 A1* | 4/2020 | Brown | G11C 11/40615 |

* cited by examiner

*Primary Examiner* — Hiep T Nguyen
(74) *Attorney, Agent, or Firm* — Myers Bigel, P.A.

(57) ABSTRACT

A semiconductor memory device includes a memory cell array having a plurality of rows of memory cells therein, and a row hammer handler configured to generate a refresh address when performing a refresh operation on the plurality rows of memory cells. The row hammer handler (RHH) includes a weight distributor configured to: receive a plurality of row addresses, assign a weight to each of the plurality of row addresses thus received, and to generate weight data corresponding to each of the plurality of row addresses. The RHH also includes an aggress address generator configured to determine an aggress address of a row of memory cells based on the weight data, and a refresh address generator configured to receive the aggress address and to generate the refresh address, which includes address information of a memory cell row adjacent the aggress address.

20 Claims, 16 Drawing Sheets

FIG. 8

| | w1 | w2 | w3 | w4 | w5 | w6 |
|---|---|---|---|---|---|---|
| | 6 | 5 | 4 | 3 | 2 | 1 |

121b t1
| RA | WT_data |
|---|---|
| r1 | W1=6 |
| r2 | W2=0 |
| r3 | W3=0 |
| r4 | W4=0 | t2
| RA | WT_data |
|---|---|
| r1 | W1=5 |
| r2 | W2=6 |
| r3 | W3=0 |
| r4 | W4=0 | t3
| RA | WT_data |
|---|---|
| r1 | W1=4 |
| r2 | W2=5 |
| r3 | W3=6 |
| r4 | W4=0 | t4
| RA | WT_data |
|---|---|
| r1 | W1=3 |
| r2 | W2=4 |
| r3 | W3=6+5=11 |
| r4 | W4=0 | t5
| RA | WT_data |
|---|---|
| r1 | W1=2 |
| r2 | W2=6+3=9 |
| r3 | W3=5+4=9 |
| r4 | W4=0 | t6
| RA | WT_data |
|---|---|
| r1 | W1=1 |
| r2 | W2=6+5+2=13 |
| r3 | W3=4+3=7 |
| r4 | W4=0 |

SEMICONDUCTOR MEMORY DEVICES HAVING ENHANCED REFRESH OPERATIONS THAT INHIBIT ROW HAMMER HACKING

REFERENCE TO PRIORITY APPLICATION

This application claims priority under 35 U.S.C. § 119 to Korean Patent Application Nos. 10-2022-0004000, filed Jan. 11, 2022, and 10-2022-0051267, filed Apr. 26, 2022, the disclosures of which are hereby incorporated herein by reference.

BACKGROUND

Embodiments of the present disclosure relate to integrated circuit devices and, more particularly, to semiconductor memory devices and systems and methods of operating same.

A semiconductor memory device may be classified as a volatile memory device, in which stored data disappear when a power supply is turned off, such as a static random access memory (SRAM) or a dynamic random access memory (DRAM), or a nonvolatile memory device, in which stored data are retained even when a power supply is turned off, such as a flash memory device, a phase-change RAM (PRAM), a magnetic RAM (MRAM), a resistive RAM (RRAM), or a ferroelectric RAM (FRAM).

Data of a volatile memory device, such as a dynamic random access memory (DRAM), are often determined based on charges stored in a capacitor. Because the charges stored in the capacitor may leak out over time under various conditions, the volatile memory device may periodically perform a refresh operation in order to replenish lost charges. In addition, as a memory device is scaled down, a space (or distance) between adjacent word lines decreases. Under these circumstances, the influence from which charges of a memory cell connected with an adjacent word line suffer increases due to a voltage distribution of one word line. In particular, in the case where one word line is repeatedly accessed over a relatively short time interval, a row hammer phenomenon may occur in which data stored in memory cells connected with a word line adjacent to an enabled word line are lost due to a repeated fluctuating voltage of the enabled word line.

SUMMARY

Embodiments of the present disclosure provide a memory device capable of inhibiting the parasitic effects of a row hammering operation. such that electrical characteristics are improved.

According to an embodiment, a semiconductor memory device includes a memory cell array having a plurality of rows of memory cells therein, and a row hammer handler that generates a refresh address to perform a refresh operation on the plurality of memory cell rows. The row hammer handler includes a weight distributor that receives a plurality of row addresses, assigns a weight to each of the plurality of row addresses thus received, and generates weight data corresponding to each of the plurality of row addresses. The row hammer handler also includes an aggress address generator, which determines an aggress address based on the weight data to thereby generate the aggress address, and a refresh address generator that receives the aggress address, and generates the refresh address including address information of a memory cell row adjacent to an aggress memory cell row.

According to an embodiment, a row hammer handling operation method of a semiconductor memory device includes receiving a plurality of row addresses chronologically, assigning weights to the plurality of row addresses respectively to generate weight data, determining an aggress address based on the weight data to generate the aggress address, generating a refresh address including address information of an adjacent memory cell row close to an aggress memory cell row based on the aggress address, and performing a refresh operation on a plurality of memory cell rows based on the refresh address.

According to another embodiment, a semiconductor memory device includes a memory cell array having a plurality of memory cell rows therein, and a row hammer handler that generates a refresh address to perform a refresh operation on the plurality of memory cell rows. The row hammer handler includes: (i) a weight distributor that receives a plurality of row addresses chronologically, assigns a weight to each of the plurality of row addresses thus received, and generates weight data corresponding to each of the plurality of row addresses, (ii) a weight counter that performs a counting operation based on the weight data and generates count data on each of the plurality of row addresses, (iii) an aggress address generator that determines an aggress address based on the count data to generate the aggress address, and (iv) a refresh address generator that receives the aggress address and generates the refresh address including address information of a memory cell row adjacent to an aggress memory cell row.

BRIEF DESCRIPTION OF THE FIGURES

The above and other objects and features of the present disclosure will become apparent by describing in detail embodiments thereof with reference to the accompanying drawings.

FIG. 8 is a diagram illustrating an embodiment of FIG. 7.

DETAILED DESCRIPTION

Below, embodiments of the present disclosure will be described in detail and clearly to such an extent that one skilled in the art easily carries out the present disclosure.

Figure 1:
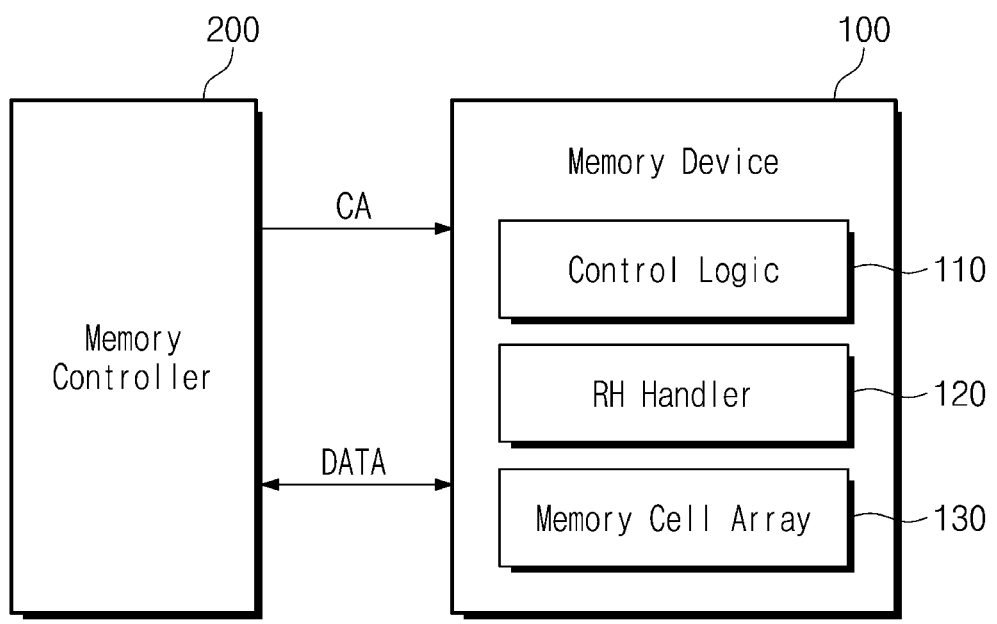
FIG. 1 is a block diagram illustrating a memory system according to an embodiment of the present disclosure.

FIG. 1, which is a block diagram illustrating a memory system 10 according to an embodiment of the present disclosure, includes a memory device 100 and a memory controller 200. The memory controller 200 may be configured to control a memory operation, such as a read operation or a write operation, by providing various kinds of signals to the memory device 100 through a memory interface. For example, the memory controller 200 may provide a command/address CA to the memory device 100 to access data "DATA" of a memory cell array 130. The command/address CA may include a command. This command may include an active command for a normal memory operation such as a data read operation or a data write operation, a precharge command, and a refresh command for a row hammer handling operation.

The active command may mean a command for switching the state of the memory cell array 130 to an active state for the purpose of writing data in the memory cell array 130 or reading data from the memory cell array 130. Memory cells included in the memory cell array 130 may be driven based on the active command.

In the specification, the access may mean that a memory cell row included in the memory cell array 130 is driven depending on the active command and an address of the memory controller 200. In contrast, the precharge command may mean a command for switching the state of the memory cell array 130 from the active state to a standby state after the data write or read operation is completed. The refresh command may mean a command for performing the refresh operation on the memory cell array 130.

The memory controller 200 may access the memory device 100 depending on a request from an external host of the memory system 10. The memory controller 200 may be configured to communicate with the host by using various protocols.

The memory device 100 may be a storage device that is based on a semiconductor element. In an embodiment, the memory device 100 may include a random access memory (RAM) such as a dynamic random access memory (DRAM), a synchronous DRAM (SDRAM), a static random access memory (SRAM), a double date rate (DDR) synchronous DRAM (SDRAM), DDR2 SDRAM, DDR3 SDRAM, a phase-change RAM (PRAM), a magnetic RAM (MRAM), or a resistive RAM (RRAM).

The memory device 100 may include an arbitrary memory device that requires the refresh operation. For example, in the case where a resistive memory device as a nonvolatile memory device performs the refresh operation, the memory device 100 may be a nonvolatile memory device.

In response to the command/address CA received from the memory controller 200, the memory device 100 may receive or output the data "DATA" through data lines or may perform the refresh operation. The memory device 100 may include control logic 110, a row hammer handler 120, and the memory cell array 130. Depending on the command/address CA received from the memory controller 200, the control logic 110 may generate control signals such that there is performed the normal memory operation such as a write operation or a read operation and the refresh operation such as a row hammer handling operation or a normal refresh operation.

The control logic 110 may be configured to generate an access signal and a row address for accessing a memory cell row. The control logic 110 may be configured to generate a refresh enable signal for performing the refresh operation. The access signal, the row address, and the refresh enable signal generated by the control logic 110 may be output to the row hammer handler 120.

The row hammer handler 120 may be configured to perform the row hammer handling operation. The row hammer handler 120 may perform one of the row hammer handling operation and the normal refresh operation, based on the refresh enable signal of the control logic 110.

In the specification, the row hammer handling operation may mean an operation of alleviating (e.g., inhibiting) a row hammer phenomenon by refreshing an adjacent memory cell row adjacent to an "aggress" memory cell row on which the row hammer handling operation is intensive. In the specification, the normal refresh operation may mean an operation of sequentially refreshing memory cell rows of a memory cell array. As will be understood by those skilled in the art, "row hammer" is a type of security exploit that takes advantage of an unintended and undesirable side effect in dynamic random-access memory (DRAM) in which memory cells interact electrically between themselves by leaking their charges, possibly changing the contents of nearby memory rows that were not addressed in the original memory access. This circumvention of the isolation between DRAM memory cells results from the high cell density in modern DRAM, and can be triggered by specially crafted memory access patterns that rapidly activate the same memory rows numerous times.

In the specification, a memory cell row on which the access is intensive is referred to as an "aggress memory cell row", and a memory cell row adjacent to the aggress memory cell row is referred to as an "adjacent memory cell row". In the specification, an address of an aggress memory cell row is referred to as an "aggress address", and an address of an adjacent memory cell row is referred to as an "adjacent address".

An embodiment in which the row hammer handler 120 performs the row hammer handling operation in response to the refresh command of the memory controller 200 is illustrated in FIG. 1, but this is one embodiment. It may be understood that the present disclosure is applied to a self-refresh operation in which the refresh operation is periodically performed within the memory device 100.

The memory cell array 130 may include a plurality of memory cell rows. Each of the memory cell rows may include a plurality of memory cells. The plurality of memory cells may be respectively located at intersections of a plurality of word lines and a plurality of bit lines. The plurality of memory cells are connected with the plurality of word lines and the plurality of bit lines. The plurality of memory cells may be provided in the form of a matrix.

In the specification, a memory cell row may mean memory cells included in one row from among the plurality of memory cells. The plurality of word lines may be respectively connected with the plurality of memory cell rows of the memory cell array 130.

Figure 2:
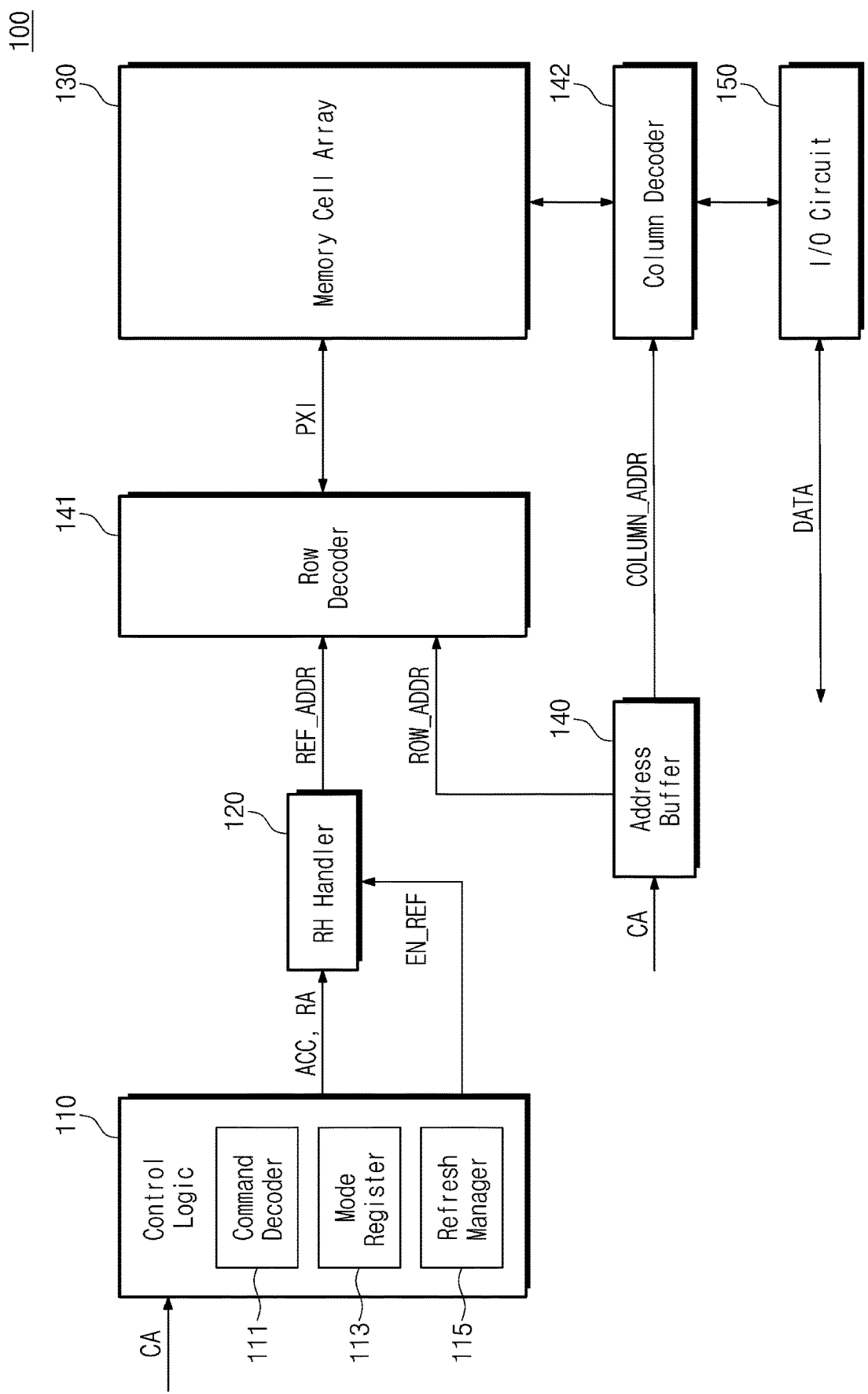
FIG. 2 is a block diagram illustrating a memory device according to an embodiment of the present disclosure.

FIG. 2 is a block diagram illustrating a memory device according to an embodiment of the present disclosure. Referring to FIG. 2, the memory device 100 may include the control logic 110, the row hammer handler 120, the memory cell array 130, an address buffer 140, a row decoder 141, a column decoder 142, and an input/output circuit 150. The memory device 100 may include a dynamic random access memory (DRAM) such as a double data rate synchronous (DDR SDRAM), a low power double data rate (LPDDR) SDRAM, a graphics double data rate (GDDR) SDRAM, or a Rambus DRAM (RDRAM).

The control logic 110 may control an overall operation of the memory device 100. The control logic 110 may include a command decoder 111, a mode register 113, and a refresh manager 115. Depending on the command/address CA from the memory controller 200 (see, e.g., FIG. 1), the control logic 110 may generate control signals such that there is performed a normal memory operation, such as a write operation or a read operation, and the refresh operation, which includes a row hammer handling operation in addition to a normal refresh operation.

The control logic 110 may generate control signals for the refresh operation of the memory cell array 130 depending on the refresh command from the memory controller 200 (see, e.g., FIG. 1). Also, the control logic 110 may generate control signals for the refresh operation of the memory cell array 130 during a self-refresh mode.

The command decoder 111 may be configured to generate control signals based on a command of the command/address CA. The command/address CA may include row address information for selecting a memory cell row of the memory cell array 130. The command/address CA may include an active command for accessing data of the memory cell array 130.

In an embodiment, the command decoder 111 may be configured to generate an access signal ACC for performing the access to memory cell rows based on the active command of the command/address CA. The command decoder 111 may be configured to generate the access signal ACC and to output the access signal ACC to the row hammer handler 120. In an embodiment, when the command is the active command, the command decoder 111 may output the access signal ACC to the row hammer handler 120.

The mode register 113 may include a plurality of registers that store information for configuring an operating environment. The refresh manager 115 may be configured to generate a refresh enable signal EN_REF based on the refresh command of the command/address CA. In some embodiments, when the command is the refresh command, the refresh manager 115 may output the refresh enable signal EN_REF to the row hammer handler 120.

The control logic 110 may be configured to generate the access signal ACC and a row address RA for the purpose of accessing memory cell rows. The control logic 110 may be configured to generate the refresh enable signal EN_REF for performing the refresh operation. The control logic 110 may output the access signal ACC, the row address RA, and the refresh enable signal EN_REF to the row hammer handler 120.

The refresh enable signal EN_REF may be periodically generated. For example, the row hammer handler 120 may perform the row hammer handling operation and/or the normal refresh operation based on the refresh enable signal EN_REF thus generated. The access signals ACC may be sequentially generated every period of the refresh enable signal EN_REF. In some embodiments, the refresh enable signal EN_REF may be generated, and in a next period, the access signal ACC may be generated once or more before the refresh enable signal EN_REF is generated.

The row hammer handler 120 may receive the access signal ACC, the row address RA, and the refresh enable signal EN_REF from the control logic 110. When the refresh enable signal EN_REF is received, the row hammer handler 120 may output a refresh address REF_ADDR for selecting a memory cell row of the memory cell array 130, on which the refresh operation is to be performed. The row hammer handler 120 may be configured to generate the refresh address REF_ADDR to perform the refresh operation on memory cell rows.

The row hammer handler 120 may be configured to generate the refresh address REF_ADDR to perform the refresh operation on a plurality of memory cell rows. The row hammer handler 120 may be configured to determine an aggress address and to generate the refresh address REF_ADDR. In the case where the row hammer handler 120 performs the row hammer handling operation, the row hammer handler 120 may output an adjacent address as the refresh address REF_ADDR.

In an embodiment, the row hammer handler 120 may be configured to perform the row hammer handling operation based on the received refresh enable signal EN_REF. In the case where an aggress address is present in the row hammer handler 120, the row hammer handler 120 may perform the row hammer handling operation. In the case of performing the row hammer handling operation, the row hammer handler 120 may generate and output an adjacent address as the refresh address REF_ADDR.

In another embodiment, the row hammer handler 120 may be configured to perform the normal refresh operation based on the received refresh enable signal EN_REF. In the case where information about an aggress address is absent from the row hammer handler 120, the row hammer handler 120 may perform the normal refresh operation. When the normal refresh operation is performed, the row hammer handler 120 may sequentially generate the refresh address REF_ADDR whose value increases depending on a counting operation of a counter included therein.

An embodiment in which the refresh address REF_ADDR indicating a row to be refreshed is generated within the memory device 100 is described with reference to FIG. 2. However, in another embodiment, the refresh manager 115 and the row hammer handler 120 may be included in the memory controller 200 (see, e.g., FIG. 1), and the refresh address REF_ADDR may be provided directly from the memory controller 200.

The memory cell array 130 may include a plurality of memory cell rows. Memory cells constituting each memory cell row may share the same word line. The address buffer 140 may receive address information of the command/address CA provided from the memory controller 200. The address information that the address buffer 140 receives may include row address information ROW_ADDR for indicating a row of the memory cell array 130 and column address information COL_ADDR for indicating a column of the memory cell array 130. The row address information ROW_ADDR may be provided to the row decoder 141, and the column address information COL_ADDR may be provided to the column decoder 142.

The row decoder 141 may receive the row address information ROW_ADDR from the address buffer 140. The row decoder 141 may generate a word line control signal PXI for selecting one (or some) of the plurality of word lines, for example, one (or some) of the plurality of memory cell rows, based on the received row address information ROW_ADDR.

The row decoder 141 may select a word line based on the row address information ROW_ADDR and may activate a memory cell row (or a selected memory cell row) corresponding to the selected word line by applying a voltage (hereinafter referred to as an "activation voltage") for turning on a memory cell row to the selected word line. After the selected word line is activated, the access to data bits of the memory cells in the selected row may be permitted.

The row decoder 141 may deactivate the selected memory cell row by applying a voltage for turning off a memory cell row to a word line selected based on the row address information ROW_ADDR. After the selected memory cell row is deactivated, the activation of another memory cell row may be permitted.

The row decoder 141 may receive the refresh address REF_ADDR from the row hammer handler 120. The row decoder 141 may activate a memory cell row that is selected based on the refresh address REF_ADDR generated by the row hammer handler 120.

The column decoder 142 may receive the column address information COL_ADDR from the address buffer 140. The column decoder 142 may select one of the plurality of bit lines of the memory cell array 130, based on the received column address information COL_ADDR.

The column decoder 142 may further include a sense amplifier and write driver. The sense amplifier and write driver may be connected with a bit line and may be configured to perform the read operation and/or the write operation.

In the case where the write operation is performed on the memory cell array 130, the column decoder 142 may charge activated memory cells connected with a bit line selected based on the received column address information COL_ADDR, by applying a voltage to a write driver connected with the bit line.

In the case where the read operation is performed on the memory cell array 130, the column decoder 142 may read data stored in the memory cells by a sense amplifier connected with the bit line.

In the case where the refresh operation is performed on the memory cell array 130, the row decoder 141 may activate a memory cell row selected based on the refresh address REF_ADDR. The column decoder 142 may refresh memory cells of the activated memory cell row by applying a voltage to a write driver connected with a bit line.

The input/output circuit 150 may exchange the data "DATA" with an external device (e.g., the memory controller 200). The input/output circuit 150 may provide the data "DATA" received from the external device to the sense amplifier and write driver or may provide the data "DATA" received from the sense amplifier and write driver to the external device.

Figure 3:
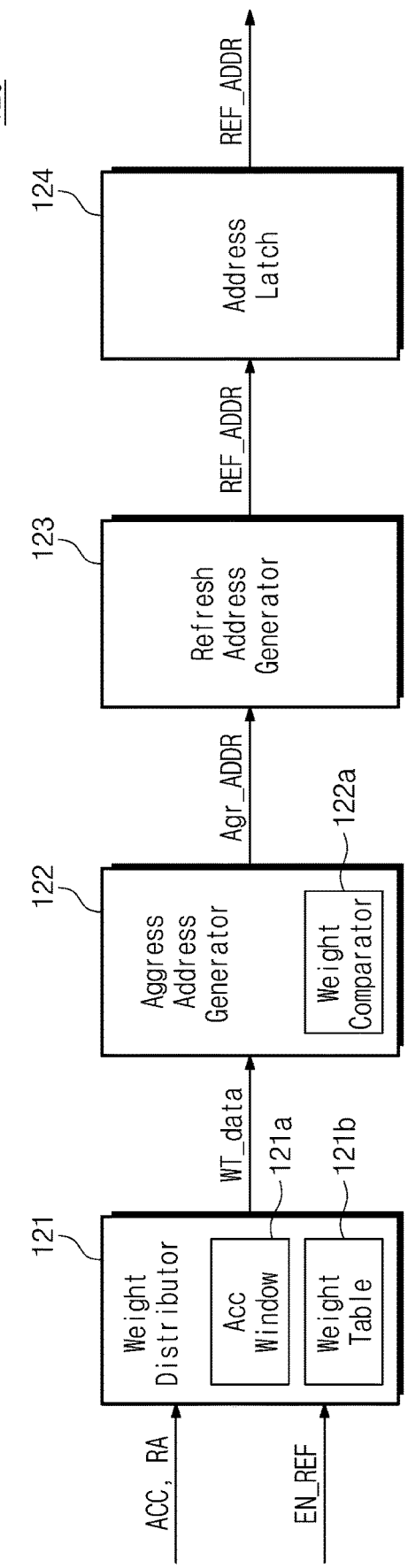
FIG. 3 is a diagram illustrating an example of a row hammer handler of FIG. 2.

A structure and an operation of the row hammer handler 120 according to an embodiment of the present disclosure will be described in detail with reference to the following drawings. For example, FIG. 3 is a diagram illustrating an embodiment of a row hammer handler of FIG. 2. Below, an embodiment of the row hammer handler 120 will be described in detail with reference to FIG. 3.

The row hammer handler 120 may include a weight distributor 121, an aggress address generator 122, a refresh address generator 123, and an address latch 124. The weight distributor 121 may be configured to receive the access signal ACC and a plurality of row addresses RA. The access signal ACC may be generated and received every given time interval, and the plurality of row addresses RA may be received in an order depending on a time order (or sequence) of the received access signal ACC.

The weight distributor 121 may include an access window 121a and a weight table 121b. The weight distributor 121 may be configured to sequentially receive the access signals ACC and the row addresses RA, to store the row addresses RA in the access window 121a, to assign weights to the row addresses RA stored in the access window 121a, to generate weight data WT_data corresponding to each of the row addresses RA, and to store the weight data WT_data in the weight table 121b. In an embodiment, in the case where two or more row addresses associated with the same memory cell row are stored in the access window 121a, the weight data WT_data of the corresponding row address may be a sum of weights assigned to the row addresses.

The access window 121a may sequentially receive the access signals ACC and the plurality of row addresses RA. The access window 121a may be configured to sequentially store the plurality of row addresses RA and to assign a weight to each of the plurality of row addresses RA.

In an embodiment, in the case where a plurality of row addresses are chronologically input to the access window 121a, a value of a weight assigned to a currently received row address may be greater than a value of a weight assigned to a previously received row address.

The access window 121a may include a plurality of sub-windows. The sub-windows may sequentially store the plurality of row addresses RA depending on the order of receiving the access signals ACC. A plurality of weights may be respectively set to the plurality of sub-windows. The plurality of weights may have different values. In an embodiment, the plurality of weights set to the plurality of sub-windows may decrease by the same decrement, but the present disclosure is not limited thereto. Each of the plurality of sub-windows may assign a weight to a row address stored therein, so as to be stored in the weight table 121b.

For example, the access window 121a may include first to sixth sub-windows. However, the present disclosure is not limited thereto. For example, the number of sub-windows constituting the access window 121a may increase or decrease. First to sixth weights may be respectively assigned to row addresses stored in the first to sixth sub-windows. In an embodiment, as it goes from the first weight to the sixth weight, a weight value may decrease by a given decrement.

The weight table 121b may be configured to generate the weight data WT_data corresponding to each row address. The weight table 121b may be configured to store a weight assigned to each of row addresses stored in the access window 121a and to generate the weight data WT_data. In the case where different weights are assigned to the same row address, the weight data WT_data of the corresponding row address may be a cumulative value of the different weights assigned thereto.

The weight distributor 121 may sequentially receive first to n-th access signals and first to n-th row addresses from the first time to the n-th time. Some (or all) of the first to n-th row addresses may be a row address of the same memory cell row, but the present disclosure is not limited thereto. For example, the first to n-th row addresses may be row addresses of different memory cell rows.

At the first time, the weight distributor 121 may receive the first access signal and the first row address. As such, the first sub-window may store the first row address corresponding to the first access signal, and row addresses may not be stored in the second to sixth sub-windows.

At the first time, a first weight may be assigned to the first row address, and the weight data WT_data on the first row address may be stored in the weight table 121b. At the second time, the weight distributor 121 may receive the second access signal and the second row address. As such, the first sub-window may store the second row address corresponding to the second access signal, the second sub-window may store the first row address corresponding to the first access signal, and row addresses may not be stored in the third to sixth sub-windows.

At the second time, the first weight may be assigned to the second row address, a second weight may be assigned to the first row address, and the weight data WT_data on the first row address and the weight data WT_data on the second row address may be stored in the weight table 121b.

At the n-th time (n being a natural number of 6 or more), the weight distributor 121 may receive the n-th access signal and the n-th row address. As such, the first sub-window may store the n-th row address corresponding the n-th access signal, the second sub-window may store the (n−1)-th row address corresponding the (n−1)-th access signal, the third sub-window may store the (n−2)-th row address corresponding the (n−2)-th access signal, the fourth sub-window may store the (n−3)-th row address corresponding the (n−3)-th access signal, the fifth sub-window may store the (n−4)-th row address corresponding the (n−4)-th access signal, and the sixth sub-window may store the (n−5)-th row address corresponding the (n−5)-th access signal.

At the n-th time (n being a natural number of 6 or more), the first weight may be assigned to the n-th row address, the second weight may be assigned to the (n−1)-th row address, the third weight may be assigned to the (n−2)-th row address, the fourth weight may be assigned to the (n−3)-th row address, the fifth weight may be assigned to the (n−4)-th row address, and the sixth weight may be assigned to the (n−5)-th row address. Then, the weight data WT_data on each row address may be stored in the weight table 121b.

The aggress address generator 122 may include a weight comparator 122a. The aggress address generator 122 may be configured to generate an aggress address Agr_ADDR based on the weight data WT_data stored in the weight table 121b.

The weight comparator 122a may be configured to determine the aggress address Agr_ADDR based on the weight data WT_data stored in the weight table 121b. The weight comparator 122a may determine whether each weight data WT_data of the weight table 121b is a reference value or more. When the weight data WT_data of a specific row address in the weight table 121b is the reference value (or more), the weight comparator 122a may determine the specific row address to be the aggress address Agr_ADDR. In response, the aggress address generator 122 may output the specific row address determined by the weight comparator 122a as the aggress address Agr_ADDR.

In an embodiment, the weight comparator 122a may determine the aggress address Agr_ADDR in real time every time at which the access signal ACC is received. As such, the aggress address generator 122 may determine the aggress address Agr_ADDR in real time every time at which the access signal ACC is received. In an embodiment, before the row hammer handler 120 receives the refresh enable signal EN_REF, the aggress address generator 122 may generate the aggress address Agr_ADDR.

In another embodiment, the weight comparator 122a may determine the aggress address Agr_ADDR when the refresh enable signal EN_REF is input to the row hammer handler 120. As such, when the refresh enable signal EN_REF is input to the weight distributor 121, the aggress address generator 122 may generate the aggress address Agr_ADDR.

The aggress address generator 122 may output the aggress address Agr_ADDR determined by the weight comparator 122a. When it is determined by the weight comparator 122a that the aggress address Agr_ADDR does not exist, the aggress address generator 122 may not output the aggress address Agr_ADDR. When the aggress address Agr_ADDR is not output from the aggress address generator 122, the row hammer handler 120 may perform a normal refresh operation.

The refresh address generator 123 may be configured to generate the refresh address REF_ADDR based on the aggress address Agr_ADDR. The refresh address REF_ADDR may include address information of adjacent memory cell rows of an aggress memory cell row.

The address latch 124 may be configured to receive and store the refresh address REF_ADDR. The address latch 124 may receive the refresh enable signal EN_REF. In the case where the refresh enable signal EN_REF is input to the row hammer handler 120, the address latch 124 may output the refresh address REF_ADDR such that the row hammer handling operation is performed.

Figure 4:
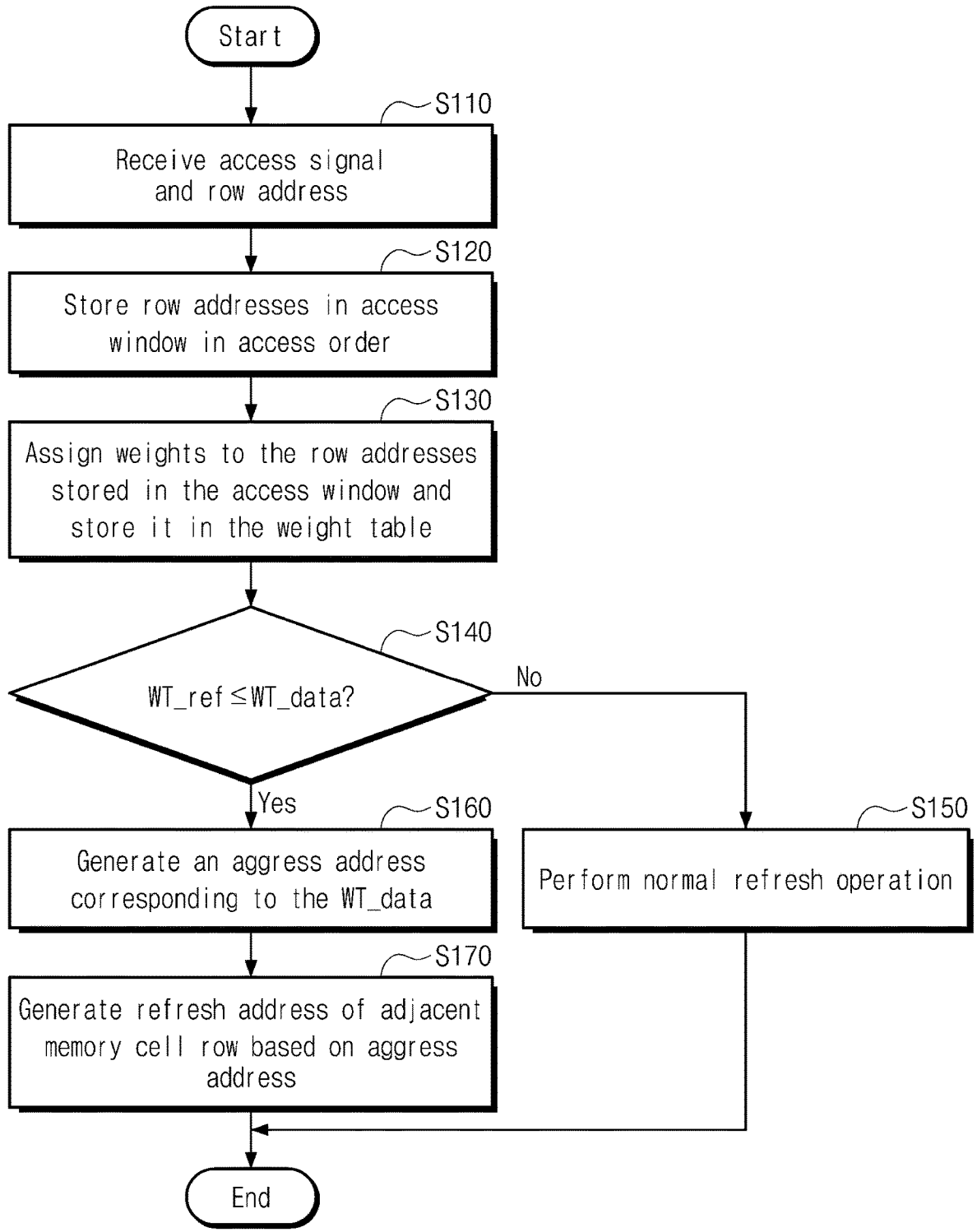
FIG. 4 is a flowchart illustrating a row hammer handling operation method of the row hammer handler of FIG. 3.

FIG. 4 is a flowchart illustrating a row hammer handling operating method of the row hammer handler of FIG. 3. How the row hammer handler 120 performs the row hammer handling operation will be described in detail with reference to FIGS. 3 and 4. Referring to FIGS. 3 and 4, in operation S110, the row hammer handler 120 may receive the access signal ACC and a row address RA. The access signal ACC may be generated every time interval, or periodically, and may be input to the row hammer handler 120. In addition, the row addresses RA may be sequentially input to the row hammer handler 120 depending on the order of receiving the access signals ACC.

In operation S120, the row hammer handler 120 may store the row addresses RA in the access window 121a (see, e.g., FIG. 3) in the order of receiving the access signals ACC. The access window 121a may include a plurality of sub-windows. The sub-windows may sequentially store the row addresses RA depending on the order of receiving the access signals ACC. A corresponding weight may be set to each sub-window.

In operation S130, the row hammer handler 120 may assign weights to the row addresses RA stored in the access window 121a so as to be stored in the weight table 121b. Each of the plurality of sub-windows may assign a weight to the row address RA stored therein, so as to be stored in the weight table 121b.

The weight table 121b may include the weight data WT_data on the row address RA. The weight data WT_data may be a cumulative value of weights respectively assigned to row addresses of the access window 121a (see, e.g., FIG. 3). In other words, in the case where different weights are assigned to the same row address, the weight data WT_data of the corresponding row address may be a cumulative value (e.g., summation) of the different weights assigned thereto.

In operation S140, the row hammer handler 120 may determine an aggress memory cell row based on the weight data WT_data stored in the weight table 121b. The row hammer handler 120 may determine whether the weight data WT_data in the weight table 121b is a reference value WT_ref or greater.

When the weight data WT_data that are the reference value WT_ref or more are absent from the weight table 121b, operation S150 may be performed. When the weight data WT_data that are the reference value WT_ref or more are present in the weight table 121b, operation S160 may be performed.

When the weight data WT_data that are the reference value WT_ref or more are absent from the weight table 121b, in operation S150, the normal refresh operation may be performed. As such, the refresh operation may be sequentially performed on a plurality of memory cell rows in a conventional manner.

However, when the weight data WT_data that are the reference value WT_ref or more are present in the weight table 121b, in operation S160, the row hammer handler 120 may generate the aggress address Agr_ADDR. The row hammer handler 120 may output a row address at which the weight data WT_data that are the reference value WT_ref or more are stored, as the aggress address Agr_ADDR.

In operation S170, the row hammer handler 120 may generate the refresh address REF_ADDR based on the aggress address Agr_ADDR. The refresh address REF_ADDR may include address information about an adjacent memory cell row (or rows) that are adjacent (e.g., close) to an aggress memory cell row corresponding to the aggress address Agr_ADDR. In the case where the refresh enable signal EN_REF is received, the row hammer handler 120 may output the refresh address REF_ADDR such that the refresh operation is performed on a memory cell row corresponding thereto.

Figure 5:
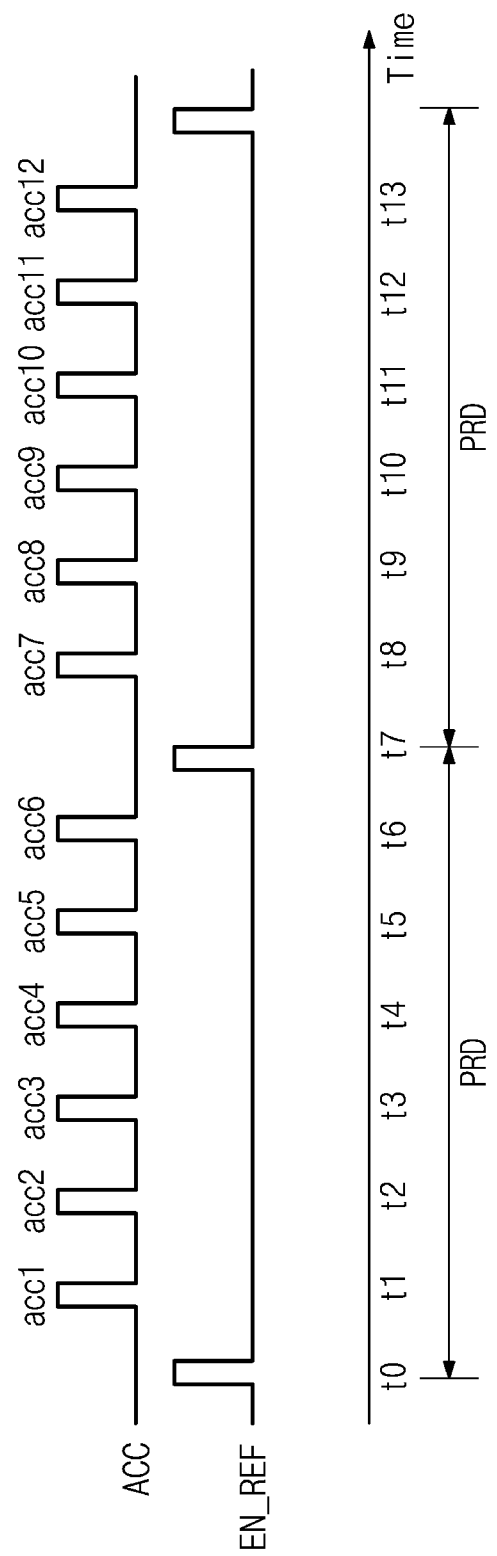
FIG. 5 is a diagram illustrating a refresh enable signal, and access signals sequentially input to the row hammer handler of FIG. 3.
Figure 6:
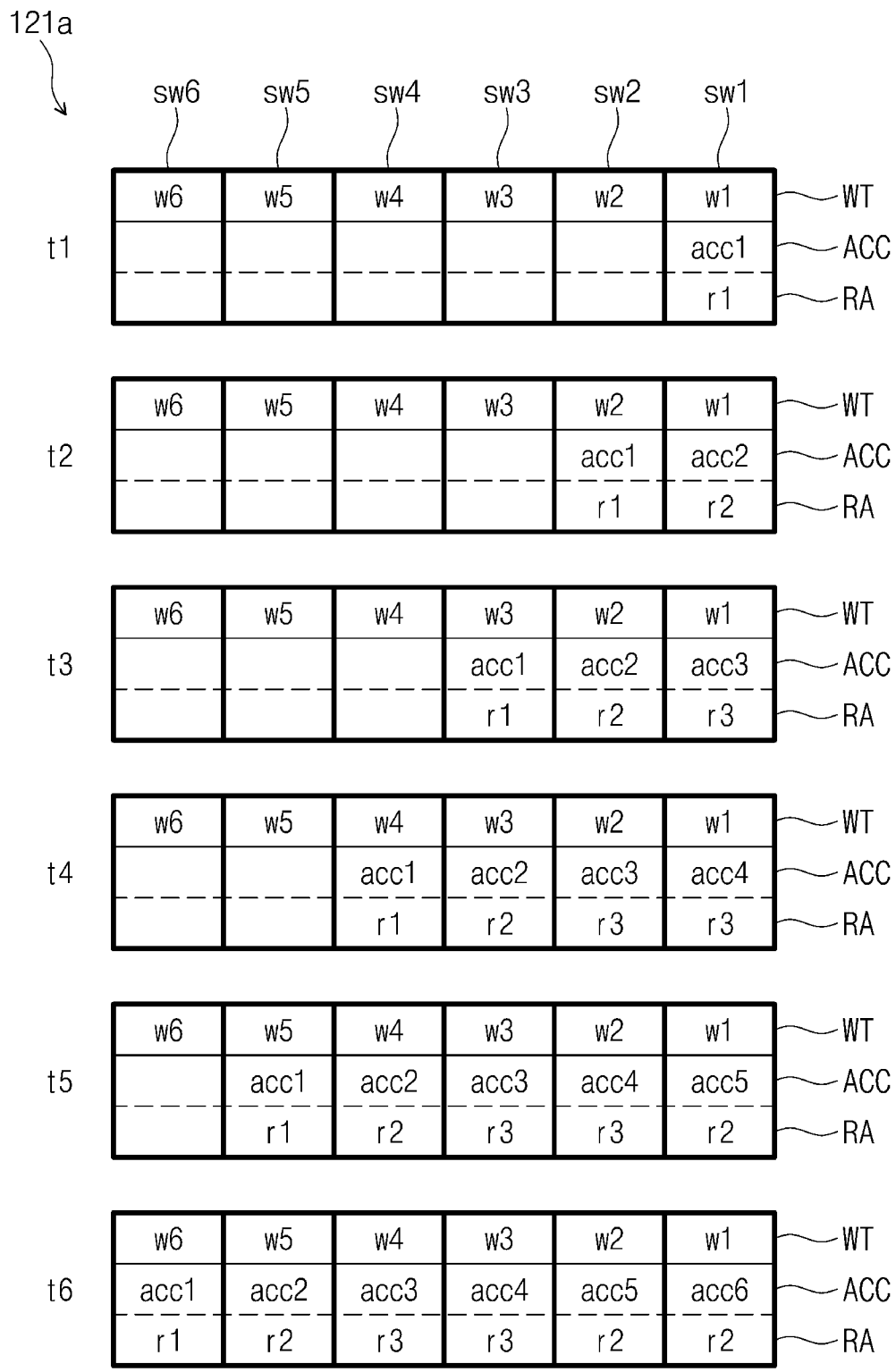
FIG. 6 is a diagram illustrating how row addresses are chronologically stored in an access window of FIG. 3 depending on signals of FIG. 5.
Figure 7:
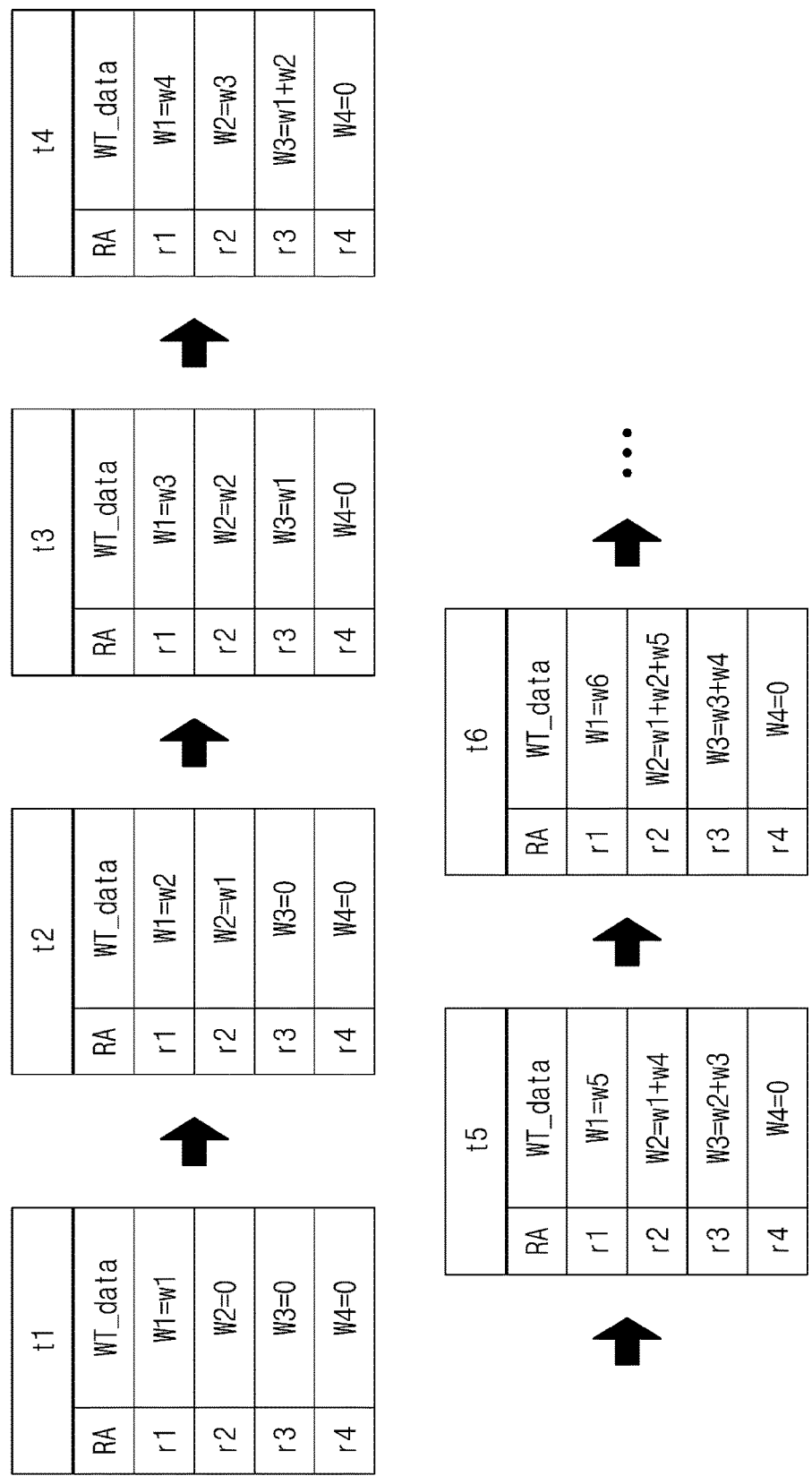
FIG. 7 is a diagram illustrating how weight data are chronologically stored in a weight table of FIG. 3.
Figure 9:
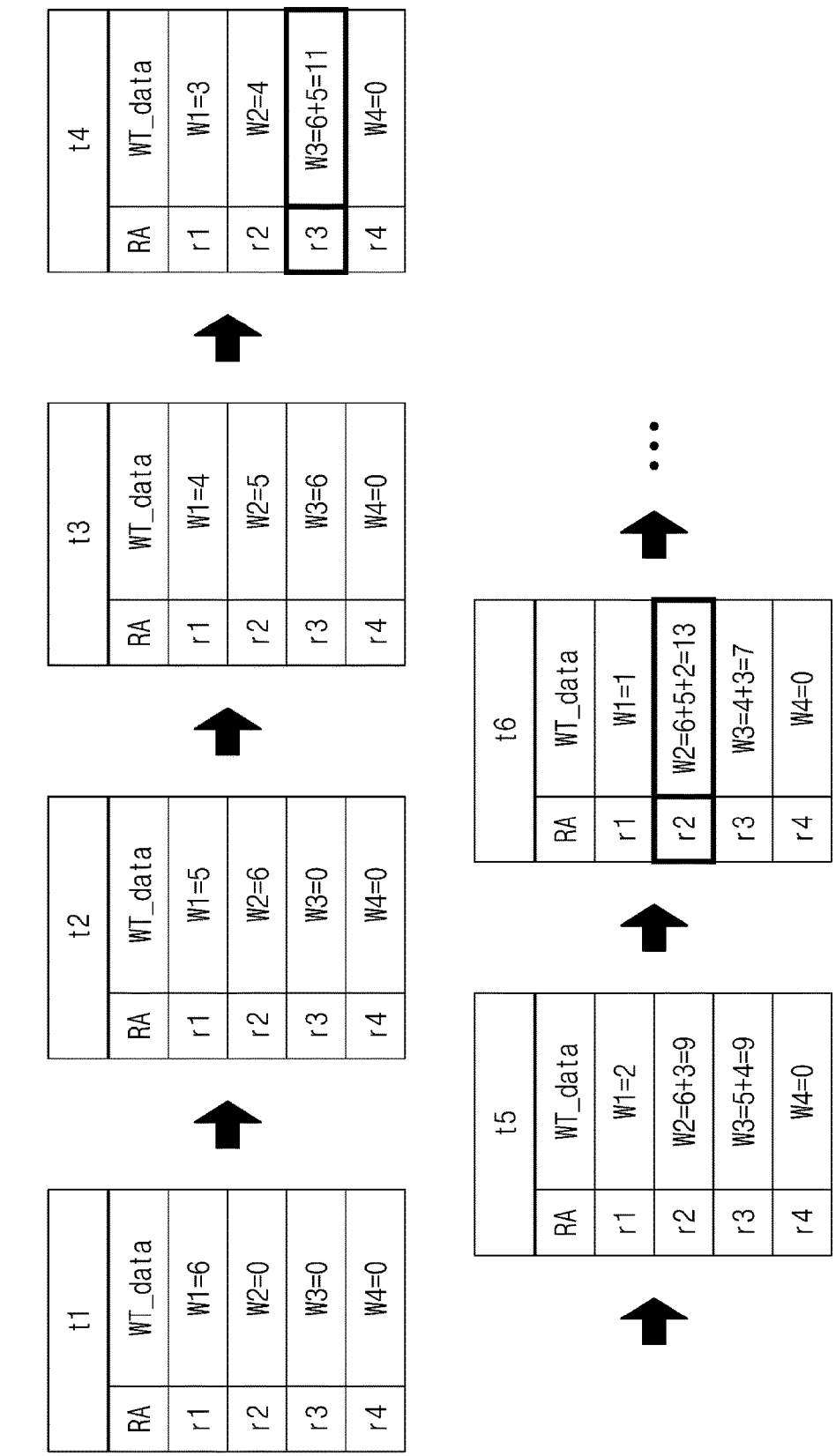
FIGS. 9 and 10 are diagrams for describing how an aggress address generator generates an aggress address.
Figure 10:
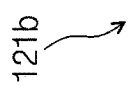

FIG. 5 is a diagram illustrating a refresh enable signal, and access signals sequentially input to a row hammer handler of FIG. 3. FIG. 6 is a diagram illustrating how row addresses are chronologically stored in an access window of FIG. 3 depending on signals of FIG. 5. FIG. 7 is a diagram illustrating how weight data are chronologically stored in a weight table of FIG. 3. FIG. 8 is a diagram illustrating an embodiment of FIG. 7. FIGS. 9 and 10 are diagrams for describing how an aggress address generator generates an aggress address. Below, a row hammer handling operation method of a row hammer handler will be described in detail with reference to FIGS. 5 to 10.

Referring now to FIG. 5, from the 0-th time, t0, to the thirteenth time, t13, access signals acc1 to acc12 and the refresh enable signal EN_REF may be input to the row hammer handler 120. However, the present disclosure is not limited thereto. For example, an access signal and the refresh enable signal EN_REF may continue to be received. As shown, at the 0-th time t0, the refresh enable signal EN_REF may be input to the row hammer handler 120. In an embodiment, the refresh enable signal EN_REF may have a given period PRD and may be repeatedly received.

For example, the refresh enable signal EN_REF may be received in units of seven time intervals, in some embodiments, but the present disclosure is not limited thereto. The period PRD at which the refresh enable signal EN_REF is received may increase or decrease. The access signals acc1 to acc6 may be received within one period in which the refresh enable signal EN_REF and a reset signal RESET (see, e.g., FIG. 11) are received.

At the first to sixth times t1 to t6, the access signals acc1 to acc6 may be input to the row hammer handler 120. The access signals acc1 to acc6 may include the first to sixth access signals acc1, acc2, acc3, acc4, acc5, and acc6. The first access signal acc1 may be received at the first time t1, the second access signal acc2 may be received at the second time t2, and the sixth access signal acc6 may be received at the sixth time t6. The access to the first to sixth row addresses may be performed by the first to sixth access signals acc1 to acc6. The first row address corresponding to the first access signal acc1 may be received, the second row address corresponding to the second access signal acc2 may be received, and the sixth row address corresponding to the sixth access signal acc6 may be received.

Some (or all) of the first to sixth row addresses may be row addresses associated with the same memory cell row, but the present disclosure is not limited thereto. For example, the first to sixth row addresses may be row addresses associated with different memory cell rows.

Address r1 may be an address corresponding to a first memory cell row. Address r2 may be an address corresponding to a second memory cell row. Address r3 may be an address corresponding to a third memory cell row. For convenience of description, address r1, address r2, and address r3 are exemplified, but the number of memory cell rows may increase or decrease. Below, the first to third memory cell rows will be described as an example. For example, the first to sixth row addresses may correspond to address r1, address r2, address r3, address r3, address r2, and address r2. The first row address may be address r1. The second, fifth, and sixth row addresses may be address r2. The third and fourth row addresses may be address r3.

At a seventh time t7, the refresh enable signal EN_REF of the next period may be input to the row hammer handler 120. At the eighth to thirteenth times t8 to t13, the access signals acc7 to acc12 may be input to the row hammer handler 120. The access signals acc7 to acc12 may include the seventh to twelfth access signals acc7, acc8, acc9, acc10, acc11, and acc12. At the eighth to thirteenth times t8 to t13, the access to the seventh to twelfth row addresses may be performed by the seventh to twelfth access signals acc7, acc8, acc9, acc10, acc11, and acc12.

Referring to FIGS. 6 and 7, from the first time t1 to the sixth time t6, row addresses corresponding to the access signals acc1 to acc6 may be sequentially stored in the access window 121a. In an embodiment, the access window 121a may include first to sixth sub-windows sw1 to sw6. Each sub-window may store a row address corresponding to an access signal.

The access window 121a may assign a weight WT to a row address stored in each of the sub-windows sw1 to sw6 during first to sixth times t1 to t6 and may store the weight data WT_data in the weight table 121b. For example, the first sub-window sw1 may assign a first weight w1 to a row address stored therein; the second sub-window sw2 may assign a second weight w2 to a row address stored therein; the third sub-window sw3 may assign a third weight w3 to a row address stored therein; the fourth sub-window sw4 may assign a fourth weight w4 to a row address stored therein; the fifth sub-window sw5 may assign a fifth weight w5 to a row address stored therein; the sixth sub-window sw6 may assign a sixth weight w6 to a row address stored therein.

At the first time t1, the row hammer handler 120 may receive the first access signal acc1 and the first row address. The access window 121a may store the first row address in the first sub-window sw1. The access window 121a may assign the first weight w1 to the first row address so as to be stored in the weight table 121b. For example, the first row address may be address r1, and the first weight w1 may be assigned to address r1 so as to be stored in the weight table 121b.

At the second time t2, the row hammer handler 120 may receive the second access signal acc2 and the second row address. The access window 121a may store the first row address in the second sub-window sw2. The access window 121*a* may store the second row address in the first sub-window sw1.

The access window 121*a* may assign the first weight w1 and the second weight w2 to the second row address and the first row address, respectively, so as to be stored in the weight table 121*b*. For example, the second row address may be address r2, and the first weight w1 and the second weight w2 may be respectively assigned to address r2 and address r1, so as to be stored in the weight table 121*b*.

At the third time t3, the row hammer handler 120 may receive the third access signal acc3 and the third row address. The access window 121*a* may store the first row address in the third sub-window sw3. The access window 121*a* may store the second row address in the second sub-window sw2. The access window 121*a* may store the third row address in the first sub-window sw1.

The access window 121*a* may assign the first weight w1, the second weight w2, and the third weight w3 to the third row address, the second row address, and the first row address respectively, so as to be stored in the weight table 121*b*. For example, the third row address may be address r3, and the first weight w1, the second weight w2, and the third weight w3 may be respectively assigned to address r3, address r2, and address r1, so as to be stored in the weight table 121*b*.

At the fourth time t4, the row hammer handler 120 may receive the fourth access signal acc4 and the fourth row address. The access window 121*a* may store the first row address in the fourth sub-window sw4. The access window 121*a* may store the second row address in the third sub-window sw3. The access window 121*a* may store the third row address in the second sub-window sw2. The access window 121*a* may store the fourth row address in the first sub-window sw1.

The access window 121*a* may assign the first weight w1, the second weight w2, the third weight w3, and the fourth weight w4 to the fourth row address, the third row address, the second row address, and the first row address respectively, so as to be stored in the weight table 121*b*.

For example, the fourth row address may be address r3, and the first weight w1, the second weight w2, the third weight w3, and the fourth weight w4 may be respectively assigned to address r3, address r3, address r2, address r1, so as to be stored in the weight table 121*b*. The weight data WT3 on address r3 may be a sum of the first weight w1 and the second weight w2.

At the fifth time t5, the row hammer handler 120 may receive the fifth access signal acc5 and the fifth row address. The access window 121*a* may store the first row address in the fifth sub-window sw5. The access window 121*a* may store the second row address in the fourth sub-window sw4. The access window 121*a* may store the third row address in the third sub-window sw3. The access window 121*a* may store the fourth row address in the second sub-window sw2. The access window 121*a* may store the fifth row address in the first sub-window sw1.

The access window 121*a* may assign the first weight w1, the second weight w2, the third weight w3, the fourth weight w4, and the fifth weight w5 to the fifth row address, the fourth row address, the third row address, the second row address, and the first row address respectively, so as to be stored in the weight table 121*b*.

For example, the fifth row address may be address r2, and the first weight w1, the second weight w2, the third weight w3, the fourth weight w4, and the fifth weight w5 may be respectively assigned to address r2, address r3, address r3, address r2, and address r1 so as to be stored in the weight table 121*b*. The weight data WT2 on address r2 may be a sum of the first weight w1 and the fourth weight w4, and the weight data WT3 on address r3 may be a sum of the second weight w2 and the third weight w3.

At the sixth time t6, the row hammer handler 120 may receive the sixth access signal acc6 and the sixth row address. The access window 121*a* may store the first row address in the sixth sub-window sw6. The access window 121*a* may store the second row address in the fifth sub-window sw5. The access window 121*a* may store the third row address in the fourth sub-window sw4. The access window 121*a* may store the fourth row address in the third sub-window sw3. The access window 121*a* may store the fifth row address in the second sub-window sw2. The access window 121*a* may store the sixth row address in the first sub-window sw1.

The access window 121*a* may assign the first weight w1, the second weight w2, the third weight w3, the fourth weight w4, the fifth weight w5, and the sixth weight w6 to the sixth row address, the fifth row address, the fourth row address, the third row address, the second row address, and the first row address respectively, so as to be stored in the weight table 121*b*.

For example, the sixth row address may be address r2, and each of the first weight w1, the second weight w2, and the fifth weight w5 may be assigned to address r2, so as to be stored in the weight table 121*b*. For example, each of the third weight w3 and the fourth weight w4 may be assigned to address r3 so as to be stored in the weight table 121*b*, and the sixth weight w6 may be assigned to address r1 so as to be stored in the weight table 121*b*. The weight data WT2 on address r2 may be a sum of the first weight w1, the second weight w2, and the fifth weight w5, and the weight data WT3 on address r3 may be a sum of the third weight w3 and the fourth weight w4. At the seventh time t7, the row hammer handler 120 may receive the refresh enable signal EN_REF. The row hammer handler 120 may output the refresh address REF_ADDR based on the refresh enable signal EN_REF.

In an embodiment, the aggress address generator 122 may generate the aggress address Agr_ADDR for each of the first to sixth times t1 to t6. At each of the first to sixth times t1 to t6, the weight comparator 122*a* may compare each of the pieces of weight data WT_data stored in the weight table 121*b* with the reference value WT_ref and may determine a row address corresponding to the weight data WT_data being the reference value WT_ref or more as the aggress address Agr_ADDR.

In an embodiment, at each of the first to sixth times t1 to t6, the aggress address generator 122 may generate the aggress address Agr_ADDR; at each of the first to sixth times t1 to t6, the refresh address generator 123 may generate the refresh address REF_ADDR; and, the address latch 124 may store the refresh addresses REF_ADDR respectively generated at the first to sixth times t1 to t6. When the address latch 124 receives the refresh enable signal EN_REF, the address latch 124 may output the refresh address REF_ADDR to the row decoder 141 (see, e.g., FIG. 2).

In an embodiment, when the refresh enable signal EN_REF is received, the aggress address generator 122 may generate the aggress address Agr_ADDR. When the refresh enable signal EN_REF is received, the weight comparator 122*a* may compare each of the pieces of weight data WT_data stored in the weight table 121*b* with the reference value WT_ref and may determine a row address corresponding to the weight data WT_data being the reference value WT_ref or more as the aggress address Agr_ADDR.

The aggress address generator 122 may output the aggress address Agr_ADDR, and the refresh address generator 123 may generate the refresh address REF_ADDR. When the address latch 124 receives the refresh enable signal EN_REF, the address latch 124 may output the refresh address REF_ADDR to the row decoder 141 (see, e.g., FIG. 2).

Referring to FIG. 8, in an embodiment, the first to sixth weights w1 to w6 may be set have values of "6" to "1". For example, the first weight w1 may be "6", the second weight w2 may be "5", the third weight w3 may be "4", the fourth weight w4 may be "3", the fifth weight w5 may be "2", and the sixth weight w6 may be "1". In an embodiment, the reference value WT_ref that is targeted for comparison with the weight data WT_data in the weight comparator 122a may be set to "10".

Referring to FIG. 9, in an embodiment, at each of the first to sixth times t1 to t6, the weight comparator 122a may compare each of the pieces of weight data WT_data stored in the weight table 121b with the reference value WT_ref and may determine a row address corresponding to the weight data WT_data being the reference value WT_ref or more as the aggress address Agr_ADDR.

For example, at the fourth time t4, address r3 may be determined to be the aggress address Agr_ADDR; at the sixth time t6, address r2 may be determined to be the aggress address Agr_ADDR. The aggress address Agr_ADDR that is output from the aggress address generator 122 may include information about address r2 and address r3.

Referring to FIG. 10, in another embodiment, at the sixth time t6, the weight comparator 122a may compare each of the pieces of weight data WT_data stored in the weight table 121b with the reference value WT_ref and may determine a row address corresponding to the weight data WT_data being the reference value WT_ref or more as the aggress address Agr_ADDR. For example, at the sixth time t6, address r2 may be determined to be the aggress address Agr_ADDR. The aggress address Agr_ADDR that is output from the aggress address generator 122 may include information about address r2. The refresh address generator 123 may receive the aggress address Agr_ADDR to generate the refresh address REF_ADDR.

In an embodiment, in the case where address r2 is included in the aggress address Agr_ADDR, the refresh address REF_ADDR may include address r1 and address r3 that are adjacent to address r2. In another embodiment, in the case where address r2 and address r3 are included in the aggress address Agr_ADDR, the refresh address REF_ADDR may include address r1 and address r3, which are adjacent to address r2, and address r2 and address r4, which are adjacent to address r3. In the case where the refresh enable signal EN_REF is received, the row hammer handler 120 may be configured to perform the refresh operation on memory cell rows corresponding to the refresh address REF_ADDR.

Figure 11:
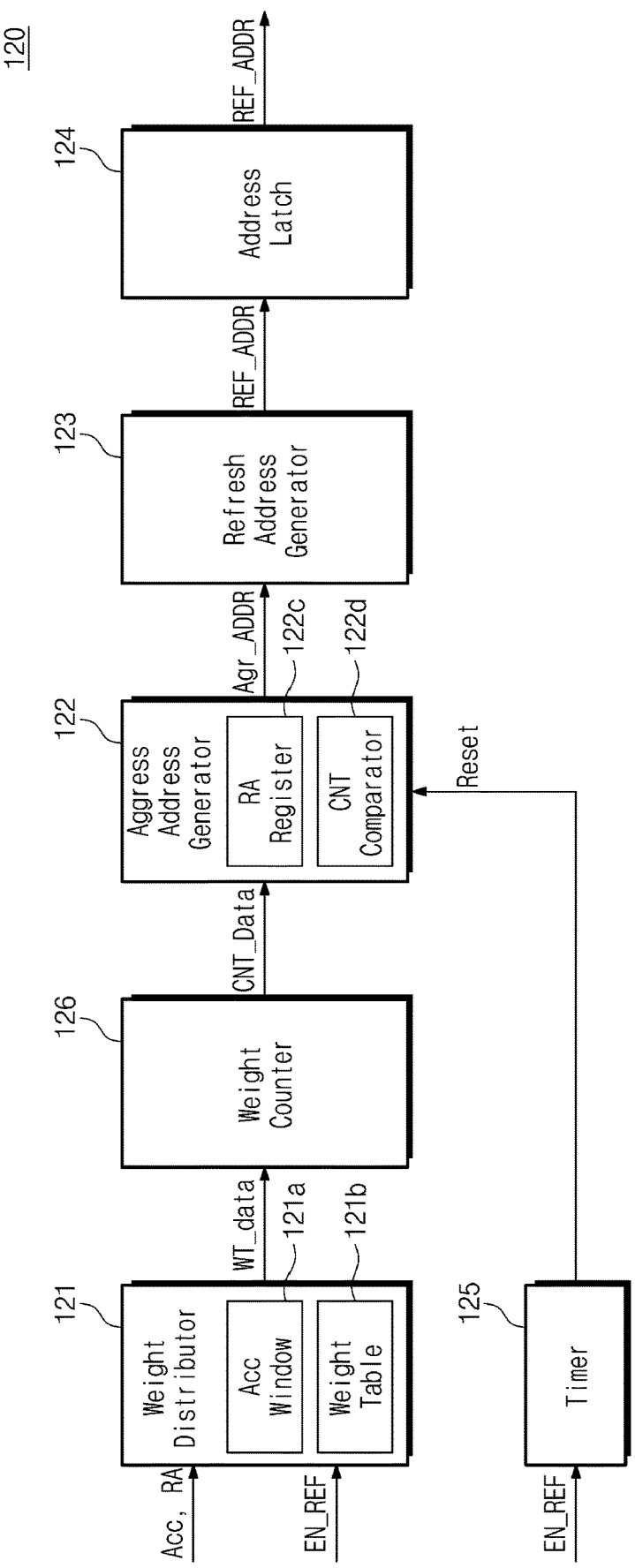
FIG. 11 is a diagram illustrating another example of a row hammer handler of FIG. 2.

FIG. 11 is a diagram illustrating another example of a row hammer handler of FIG. 2. A structure and an operation of a row hammer handler will be described in detail with reference to FIG. 11. Below, a difference will be described in detail except for substantially the same description given with reference to FIG. 2. Referring to FIG. 11, the row hammer handler 120 may include the weight distributor 121, a weight counter 126, the aggress address generator 122, the refresh address generator 123, the address latch 124, and a timer 125.

Structures and operations of the weight distributor 121, the refresh address generator 123, and the address latch 124 may be substantially the same as the structures and operations of the weight distributor 121, the refresh address generator 123, and the address latch 124 described with reference to FIG. 3. The weight distributor 121 may include the access window 121a and the weight table 121b. The weight distributor 121 may be configured to receive the access signals ACC and the row addresses RA, to store the row addresses RA in the access window 121a, to assign weights to the row addresses RA stored in the access window 121a, and to store weight data assigned to each row address in the weight table 121b. The detailed structure and operation of the weight distributor 121 may be substantially the same as those described with reference to FIG. 3.

The weight counter 126 may be configured to generate count data CNT_data based on each of the pieces of weight data WT_data stored in the weight table 121b. The weight counter 126 may be configured to perform a counting operation on each of the pieces of weight data WT_data to generate the count data CNT_data.

When the weight data WT_data belongs to a first range, the weight counter 126 may perform the counting operation with a first count value; when the weight data WT_data belongs to a second range, the weight counter 126 may perform the counting operation with a second count value. The weight counter 126 may accumulate a count value for each row address to generate the count data CNT_data.

In an embodiment, the first range may not overlap the second range, and a maximum value of the first range is smaller than a minimum value of the second range. For example, the first count value may be further smaller than the second count value.

When the weight data WT_data corresponding to each of the row addresses RA belongs to the first range, the weight counter 126 may perform the counting operation with the first count value. When the weight data WT_data corresponding to each of the row addresses RA belongs to the second range, the weight counter 126 may perform the counting operation with the second count value. The weight counter 126 may generate the count data CNT_data in the order of receiving, at the row hammer handler 120, the access signals ACC and the row addresses RA.

The aggress address generator 122 may include a count register 122c and a count comparator 122d. The aggress address generator 122 may be configured to receive and store the count data CNT_data from the weight counter 126, to determine an aggress address based on the count data CNT_data, and to generate the aggress address Agr_ADDR based on a determination result.

The count register 122c may store the count data CNT_data corresponding to each of row addresses. In the case where the counting operation is performed on the same row address several times, the count register 122c may store a cumulative value of count values as the count data CNT_data.

The count comparator 122d may be configured to determine an aggress address based on the count data CNT_data stored in the count register 122c. The count comparator 122d may determine whether the count data CNT_data is a reference value or more. When the count data CNT_data of a specific row address in the count register 122c is the reference value or more, the count comparator 122d may determine the specific row address to be an aggress address. The aggress address generator 122 may generate and output the specific row address determined by the count comparator 122d as the aggress address Agr_ADDR.

In an embodiment, the count comparator 122*d* may determine the aggress address in real time every time at which the access signal ACC is received. As such, before the row hammer handler 120 receives the refresh enable signal EN_REF, the aggress address generator 122 may generate the aggress address Agr_ADDR. However, in another embodiment, the count comparator 122*d* may determine the aggress address when the refresh enable signal EN_REF is received. As such, when the row hammer handler 120 receives the refresh enable signal EN_REF, the aggress address generator 122 may generate the aggress address Agr_ADDR.

The aggress address generator 122 may output the aggress address Agr_ADDR determined by the count comparator 122*d*. When it is determined by the count comparator 122*d* that the aggress address does not exist, the aggress address generator 122 may not output the aggress address Agr_ADDR. When the aggress address Agr_ADDR is not output from the aggress address generator 122, the row hammer handler 120 may perform the normal refresh operation.

The refresh address generator 123 may be configured to receive the aggress address Agr_ADDR to generate the refresh address REF_ADDR. The refresh address REF_ADDR may include adjacent addresses of adjacent memory cell rows close to an aggress memory cell row. A structure and an operation of the refresh address generator 123 may be substantially the same as those described with reference to FIG. 2.

The address latch 124 may be configured to receive and store the refresh address REF_ADDR. The address latch 124 may receive the refresh enable signal EN_REF. In the case where the refresh enable signal EN_REF is input to the row hammer handler 120, the address latch 124 may output the refresh address REF_ADDR such that the row hammer handling operation is performed.

The timer 125 may be configured to generate the reset signal RESET for initializing (or resetting) the count register 122*c* periodically. In an embodiment, the timer 125 may generate the reset signal RESET when the refresh enable signal EN_REF is received. In another embodiment, the timer 125 may generate the reset signal RESET regardless of the refresh enable signal EN_REF (not illustrated).

The reset signal RESET may be generated periodically. In an embodiment, a period at which the reset signal RESET is generated may be identical to a period at which the refresh enable signal EN_REF is generated, but the present disclosure is not limited thereto.

The reset signal RESET may be output to the aggress address generator 122. In the case where the aggress address generator 122 receives the reset signal RESET, the count register 122*c* may be reset to an initial state such that all the count data CNT_data stored therein are deleted.

Figure 12:
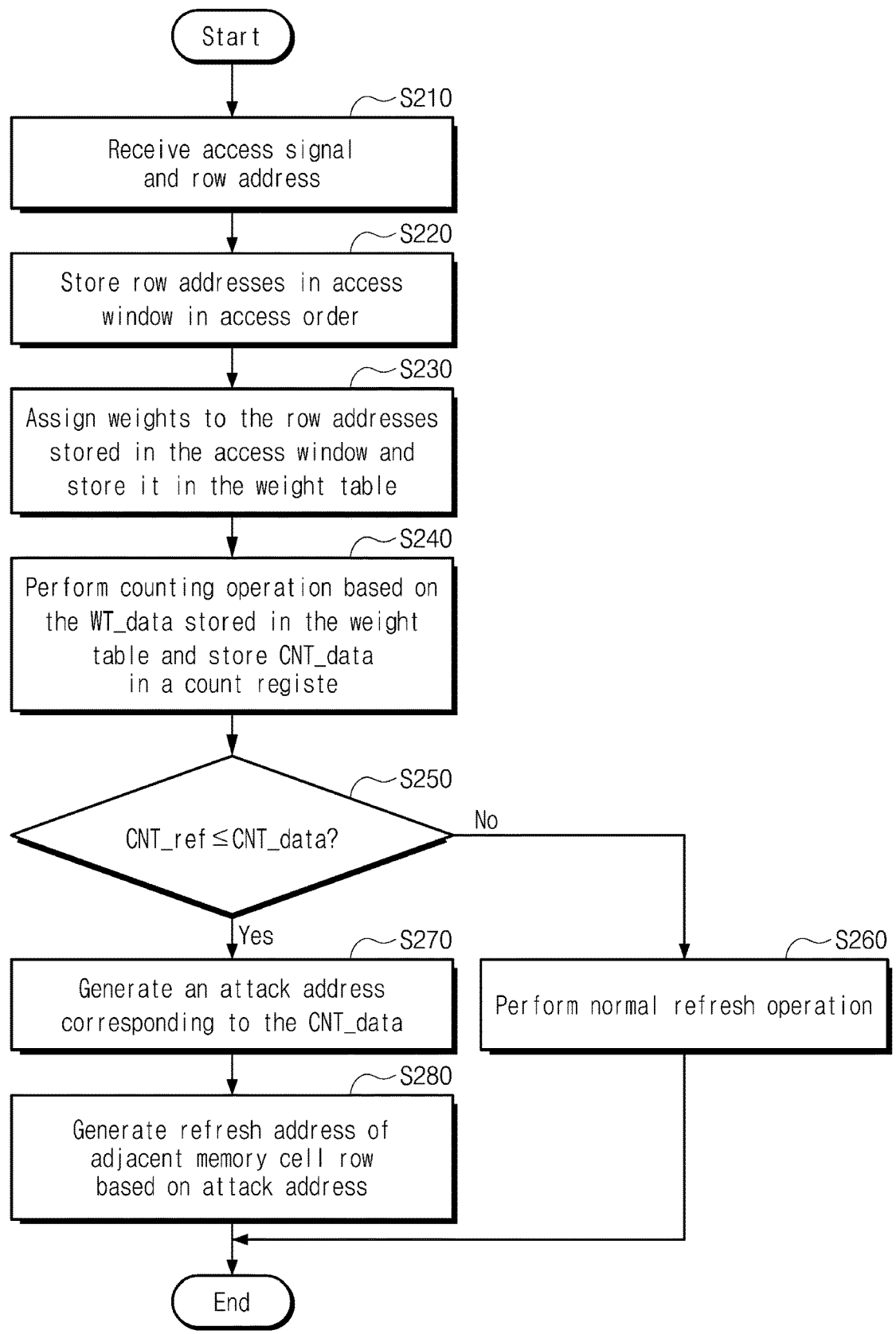
FIG. 12 is a flowchart illustrating a row hammer handling operation method of the row hammer handler of FIG. 11.

FIG. 12 is a flowchart illustrating a row hammer handling operation method of a row hammer handler of FIG. 11. How the row hammer handler 120 performs the row hammer handling operation will be described in detail with reference to FIGS. 11 and 12. Referring to FIGS. 11 and 12, in operation S210, the row hammer handler 120 may receive the access signal ACC and the row address RA. The access signal ACC may be generated every time interval, or periodically, and may be input to the row hammer handler 120, and the row addresses RA may be sequentially input to the row hammer handler 120 depending on the order of receiving the access signals ACC.

In operation S220, the row hammer handler 120 may store the row addresses RA in the access window 121*a* in the order of receiving the access signals ACC. The access window 121*a* may include a plurality of sub-windows. The sub-windows may sequentially store the row addresses RA depending on the order of receiving the access signals ACC. A corresponding weight may be set to each sub-window.

In operation S230, the row hammer handler 120 may assign weights to the row addresses RA stored in the access window 121*a* so as to be stored in the weight table 121*b*. Each of the plurality of sub-windows may assign a weight to a row address stored therein, and data on each weight may be stored in the weight table 121*b*. The weight table 121*b* may include the weight data WT_data on each row address. The weight data WT_data may be a cumulative value of weights respectively assigned to row addresses of the access window 121*a* (see, e.g., FIG. 11).

In operation S240, the row hammer handler 120 may perform the counting operation on each of the pieces of weight data WT_data stored in the weight table 121*b*, may generate the count data CNT_data, and may store the count data CNT_data in the count register 122*c*. The count register 122*c* may store the count data CNT_data corresponding to each of row addresses. In the case where the count data CNT_data on the same row address are received several times, the count register 122*c* may store a cumulative value of the pieces of count data CNT_data thus received.

In operation S250, the row hammer handler 120 may determine an aggress memory cell row based on the count data CNT_data stored in the count register 122*c*. The row hammer handler 120 may determine whether the count data CNT_data in the count register 122*c* are a reference value CNT_ref or more. When the count data CNT_data being the reference value CNT_ref or more are absent from the count register 122*c*, operation S260 may be performed. However, when the count data CNT_data being the reference value CNT_ref or more are present in the count register 122*c*, operation S270 may be performed.

When the count data CNT_data being the reference value CNT_ref or more are absent from the count register 122*c*, in operation S260, the normal refresh operation may be performed. As such, the refresh operation may be sequentially performed on a plurality of memory cell rows.

When the count data CNT_data being the reference value CNT_ref or more are present in the count register 122*c*, in operation S270, the row hammer handler 120 may generate the aggress address Agr_ADDR. The row hammer handler 120 may output a row address at which the count data CNT_data being the reference value WT_ref or more are stored, as the aggress address Agr_ADDR.

In operation S280, the row hammer handler 120 may output the refresh address REF_ADDR based on the aggress address Agr_ADDR. The refresh address REF_ADDR may include address information about adjacent memory cell rows that are close to an aggress memory cell row corresponding to the aggress address Agr_ADDR.

Figure 13:
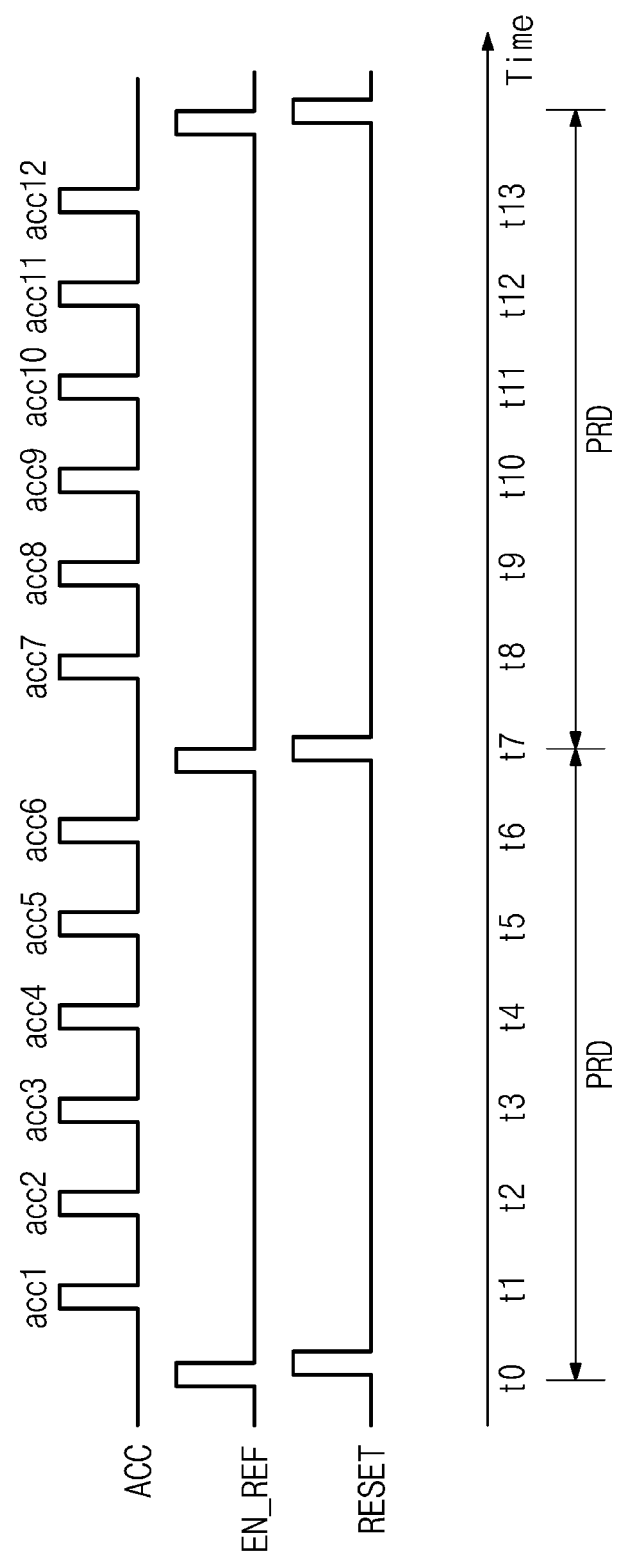
FIG. 13 is a diagram illustrating access signals sequentially input to a row hammer handler of FIG. 11, a reset signal, and an enable signal.
Figure 14:
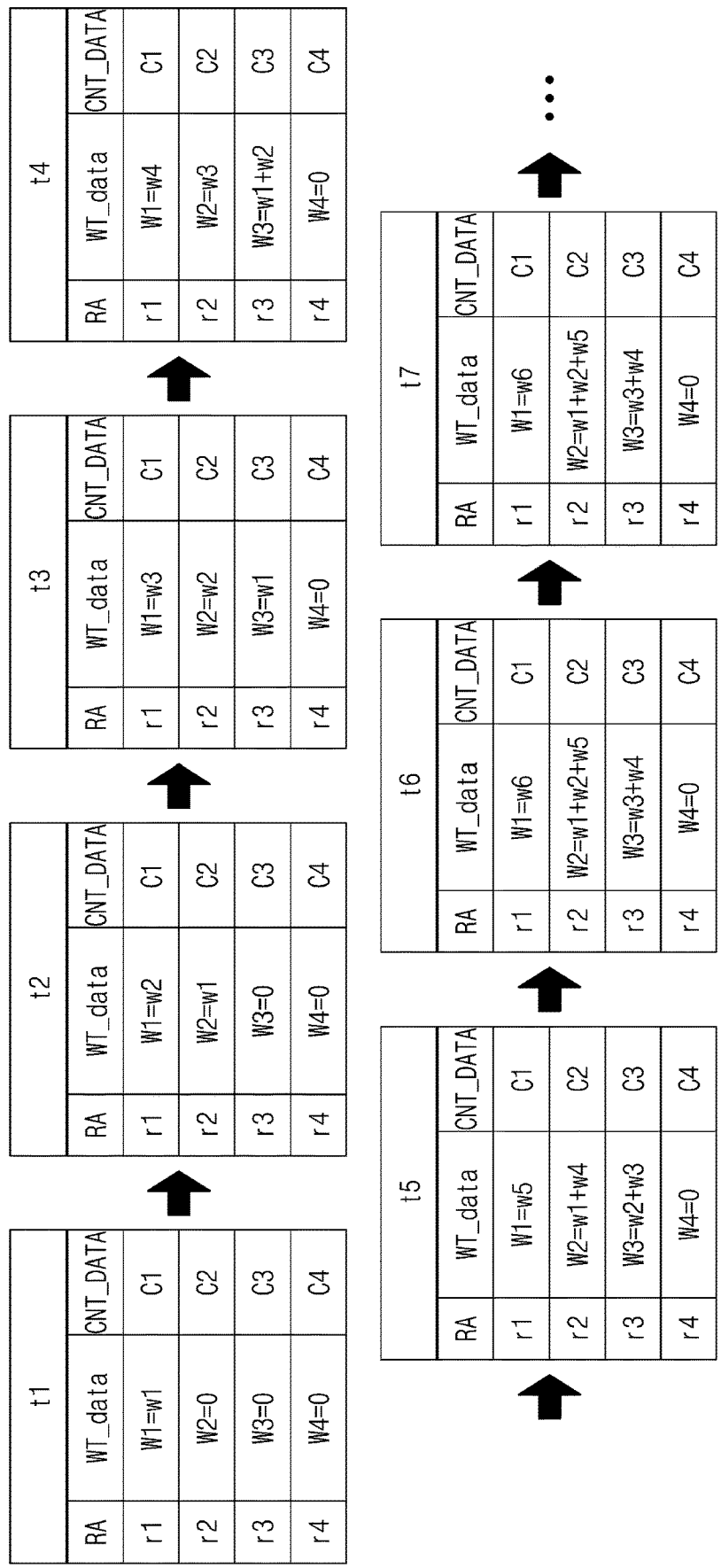
FIG. 14 is a diagram illustrating how count data are chronologically stored in a count register of FIG. 11 (depending on the timing of FIGS. 5 and 6).
Figure 15:
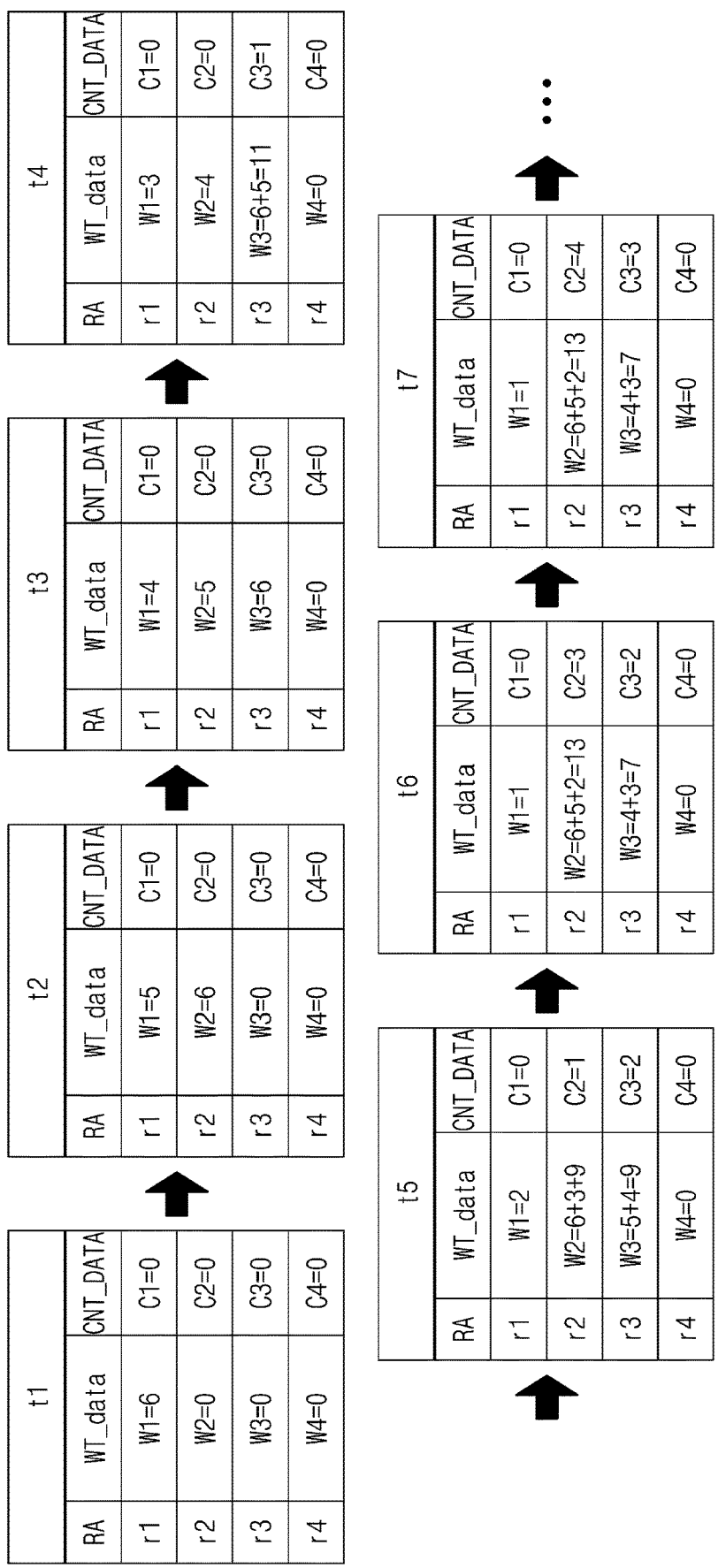
FIG. 15 is a diagram illustrating an embodiment of FIG. 14.
Figure 16:
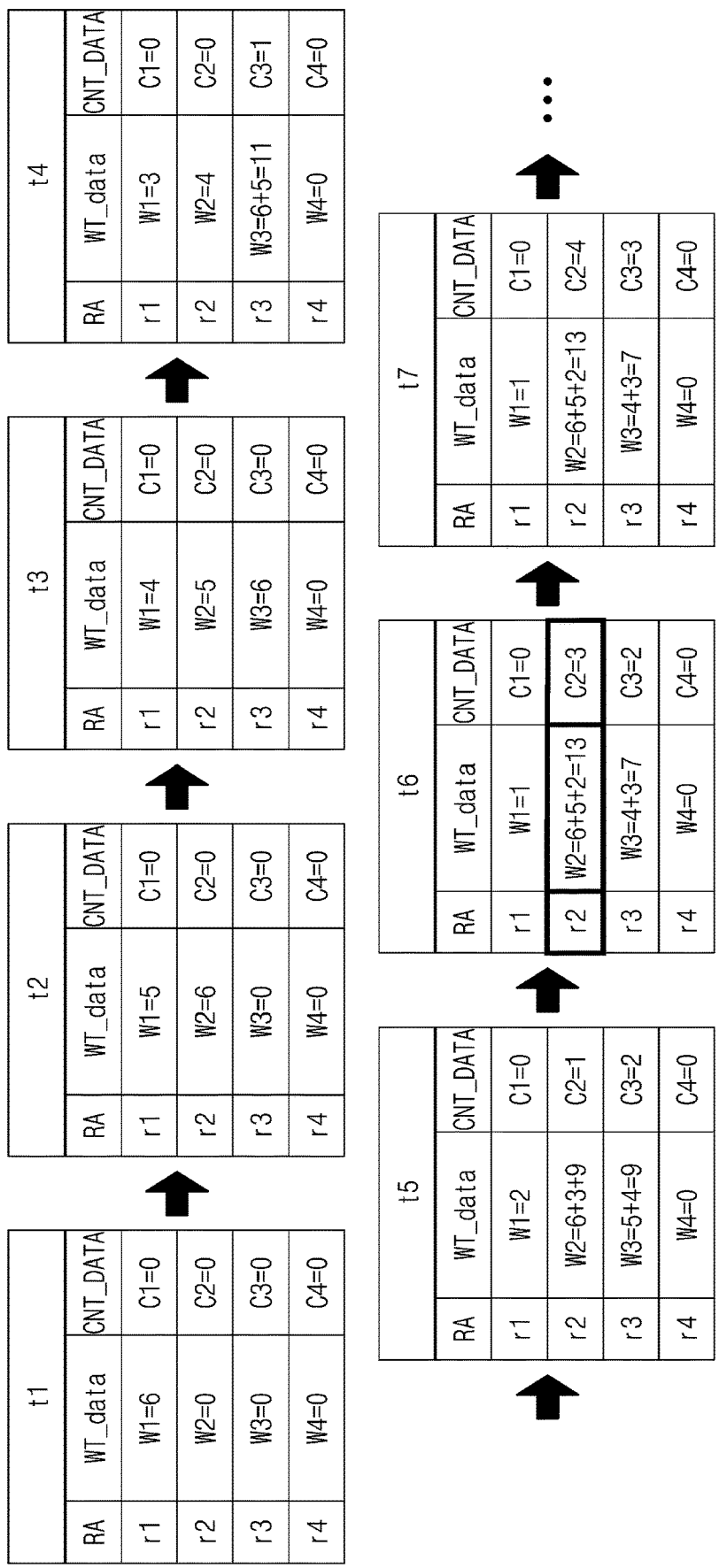
FIG. 16 is a diagram for describing how an aggress address generator determines an aggress address.

Below, an example of how the row hammer handler 120 of FIG. 11 performs the row hammer handling operation based on the access signals acc1 to acc12 and the row addresses identical to those of FIG. 6 will be described in detail with reference to drawings. In particular, FIG. 13 is a diagram illustrating access signals sequentially input to a row hammer handler of FIG. 11, a reset signal, and an enable signal. FIG. 14 is a diagram illustrating how count data are chronologically stored in a count register of FIG. 11 depending on the timing of FIGS. 6 and 13. FIG. 15 is a diagram illustrating an embodiment of FIG. 14. FIG. 16 is a diagram for describing how an aggress address generator determines an aggress address. Below, an embodiment of the row hammer handling operation will be described in detail with reference to FIGS. 13 to 16 together with FIGS. 6 and 7.

Referring to FIG. 13, from the 0-th time t0 to the thirteenth time t13, the access signals acc1 to acc12, the refresh enable signal EN_REF, and the reset signal RESET may be input to the row hammer handler 120. However, the present disclosure is not limited thereto. For example, an access signal, the refresh enable signal EN_REF, and the reset signal RESET may continue to be received.

At the 0-th time t0, the refresh enable signal EN_REF and the reset signal RESET may be input to the row hammer handler 120. In an embodiment, each of the refresh enable signal EN_REF and the reset signal RESET may have the given period PRD and may be repeatedly received.

For example, each of the refresh enable signal EN_REF and the reset signal RESET may be received in units of seven time intervals. However, the present disclosure is not limited thereto. The period PRD at which the refresh enable signal EN_REF and the reset signal RESET are received may increase or decrease. The access signals acc1 to acc6 may be received within one period in which the refresh enable signal EN_REF and the reset signal RESET are received.

In an embodiment, the refresh enable signal EN_REF may be received prior to the reset signal RESET. In another embodiment, the refresh enable signal EN_REF may be received at the same time with the reset signal RESET. At the first to sixth times t1 to t6, the access signals acc1 to acc6 may be input to the row hammer handler 120. The access signals acc1 to acc6 may include the first to sixth access signals acc1, acc2, acc3, acc4, acc5, and acc6. The access to the first to sixth row addresses may be performed by the first to sixth access signals acc1 to acc6.

Some (or all) of the first to sixth row addresses may be row addresses associated with the same memory cell row, but the present disclosure is not limited thereto. For example, the first to sixth row address may be row addresses associated with different memory cell rows. Thus, the first to sixth row addresses may correspond to address r1, address r2, address r3, address r3, address r2, and address r2. The first row address may be address r1. The second, fifth, and sixth row addresses may be address r2. The third and fourth row addresses may be address r3.

At the seventh time t7, the refresh enable signal EN_REF and the reset signal RESET of the next period may be input to the row hammer handler 120. At the eighth to thirteenth times t8 to t13, the access signals acc7 to acc12 may be input to the row hammer handler 120. The access signals acc7 to acc12 may include the seventh to twelfth access signals acc7, acc8, acc9, acc10, acc11, and acc12. The access to the seventh to twelfth row addresses may be performed by the seventh to twelfth access signals acc7, acc8, acc9, acc10, acc11, and acc12.

Referring to FIGS. 6 and 7, as described above, from the first time t1 to the sixth time t6, row addresses corresponding to the access signals acc1 to acc6 may be sequentially stored in the access window 121a. In an embodiment, the access window 121a may include the first to sixth sub-windows sw1 to sw6. Each sub-window may store a row address corresponding to an access signal.

From the first time t1 to the sixth time t6, the access window 121a may assign a weight to a row address stored in each of the sub-windows sw1 to sw6 and may store the weight data WT_data in the weight table 121b. At the first time t1, the row hammer handler 120 may receive the first access signal acc1 and the first row address. The access window 121a may store the first row address in the first sub-window sw1.

The access window 121a may assign the first weight w1 to the first row address so as to be stored in the weight table 121b. For example, the first row address may be address r1, and the first weight w1 may be assigned to address r1 so as to be stored in the weight table 121b.

At the second time t2, the row hammer handler 120 may receive the second access signal acc2 and the second row address. The access window 121a may store the first row address in the second sub-window sw2. The access window 121a may store the second row address in the first sub-window sw1.

The access window 121a may assign the first weight w1 and the second weight w2 to the second row address and the first row address respectively, so as to be stored in the weight table 121b. For example, the second row address may be address r2, and the first weight w1 and the second weight w2 may be respectively assigned to address r2 and address r1, so as to be stored in the weight table 121b.

At the third time t3, the row hammer handler 120 may receive the third access signal acc3 and the third row address. The access window 121a may store the first row address in the third sub-window sw3. The access window 121a may store the second row address in the second sub-window sw2. The access window 121a may store the third row address in the first sub-window sw1.

The access window 121a may assign the first weight w1, the second weight w2, and the third weight w3 to the third row address, the second row address, and the first row address respectively, so as to be stored in the weight table 121b. For example, the third row address may be address r3, and the first weight w1, the second weight w2, and the third weight w3 may be respectively assigned to address r3, address r2, and address r1, so as to be stored in the weight table 121b.

At the fourth time t4, the row hammer handler 120 may receive the fourth access signal acc4 and the fourth row address. The access window 121a may store the first row address in the fourth sub-window sw4. The access window 121a may store the second row address in the third sub-window sw3. The access window 121a may store the third row address in the second sub-window sw2. The access window 121a may store the fourth row address in the first sub-window sw1.

The access window 121a may assign the first weight w1, the second weight w2, the third weight w3, and the fourth weight w4 to the fourth row address, the third row address, the second row address, and the first row address respectively, so as to be stored in the weight table 121b. For example, the fourth row address may be address r3, and the first weight w1, the second weight w2, the third weight w3, and the fourth weight w4 may be respectively assigned to address r3, address r3, address r2, address r1, so as to be stored in the weight table 121b. The weight data WT3 on address r3 may be a sum of the first weight w1 and the second weight w2.

At the fifth time t5, the row hammer handler 120 may receive the fifth access signal acc5 and the fifth row address. The access window 121a may store the first row address in the fifth sub-window sw5. The access window 121a may store the second row address in the fourth sub-window sw4. The access window 121a may store the third row address in the third sub-window sw3. The access window 121a may store the fourth row address in the second sub-window sw2. The access window 121a may store the fifth row address in the first sub-window sw1.

The access window 121a may assign the first weight w1, the second weight w2, the third weight w3, the fourth weight w4, and the fifth weight w5 to the fifth row address, the fourth row address, the third row address, the second row address, and the first row address respectively, so as to be stored in the weight table 121b. For example, the fifth row address may be address r2, and the first weight w1, the second weight w2, the third weight w3, the fourth weight w4, and the fifth weight w5 may be respectively assigned to address r2, address r3, address r3, address r2, and address r1 so as to be stored in the weight table 121b. The weight data WT2 on address r2 may be a sum of the first weight w1 and the fourth weight w4, and the weight data WT3 on address r3 may be a sum of the second weight w2 and the third weight w3.

At the sixth time t6, the row hammer handler 120 may receive the sixth access signal acc6 and the sixth row address. The access window 121a may store the first row address in the sixth sub-window sw6. The access window 121a may store the second row address in the fifth sub-window sw5. The access window 121a may store the third row address in the fourth sub-window sw4. The access window 121a may store the fourth row address in the third sub-window sw3. The access window 121a may store the fifth row address in the second sub-window sw2. The access window 121a may store the sixth row address in the first sub-window sw1.

The access window 121a may assign the first weight w1, the second weight w2, the third weight w3, the fourth weight w4, the fifth weight w5, and the sixth weight w6 to the sixth row address, the fifth row address, the fourth row address, the third row address, the second row address, and the first row address respectively, so as to be stored in the weight table 121b. For example, the sixth row address may be address r2, and each of the first weight w1, the second weight w2, and the fifth weight w5 may be assigned to address r2, so as to be stored in the weight table 121b. For example, each of the third weight w3 and the fourth weight w4 may be assigned to address r3 so as to be stored in the weight table 121b, and the sixth weight w6 may be assigned to address r1 so as to be stored in the weight table 121b. The weight data WT2 on address r2 may be a sum of the first weight w1, the second weight w2, and the fifth weight w5, and the weight data WT3 on address r3 may be a sum of the third weight w3 and the fourth weight w4.

At the seventh time t7, the row hammer handler 120 may receive the refresh enable signal EN_REF. At the seventh time t7, the aggress address generator 122 may receive the reset signal RESET from the timer 125. The row hammer handler 120 may output the refresh address REF_ADDR based on the refresh enable signal EN_REF. The aggress address generator 122 may reset the count register 122c to the initial state based on the reset signal RESET such that weight data stored in the count register 122c are removed.

Referring to FIG. 14, from the first time t1 to the sixth time t6, the weight counter 126 may perform the counting operation on each of the pieces of weight data WT_data stored in the weight table 121b and may store the count data CNT_data in the count register 122c.

When the weight data WT_data belongs to the first range every time, the weight counter 126 may perform the counting operation with the first count value; when the weight data WT_data belongs to the second range, the weight counter 126 may perform the counting operation with the second count value. As such, the count data CNT_data in the count register 122c, which correspond to each of row addresses, may be updated every time.

Referring to FIG. 15, in an embodiment, the first to sixth weights w1 to w6 may be set to have values of "6" to "1". For example, the first weight w1 may be "6", the second weight w2 may be "5", the third weight w3 may be "4", the fourth weight w4 may be "3", the fifth weight w5 may be "2", and the sixth weight w6 may be "1". In an embodiment, the first range may be from 9 to 11, the second range may be from 12 to a value more than 12, the first count value may be +1, and the second count value may be +2. In an embodiment, a reference value that is targeted for comparison with the count data CNT_data in the count comparator 122d may be set to "3".

From the first time t1 to the third time t3, because each of the pieces of weight data WT_data is less than 9, the weight counter 126 may not perform the counting operation. At the fourth time t4, because the weight data WT_data corresponding to the row address r3 are 11 (i.e., belong to the first range), a value of +1 (i.e., the first count value) may be counted up with respect to the row address r3, and data on the count value (i.e., count data) may be stored in the count register 122c. At the fifth time t5, because the weight data WT_data corresponding to the row address r2 are 9 (i.e., belong to the first range), a value of +1 (i.e., the first count value) may be counted up with respect to the row address r2, and data on the count value may be stored in the count register 122c. At the fifth time t5, also, because the weight data WT_data corresponding to the row address r3 are 9 (i.e., belong to the first range), a value of +1 (i.e., the first count value) may be counted up with respect to the row address r3, and a cumulative value of 2 may be stored in the count register 122c. At the sixth time t6, because the weight data WT_data corresponding to the row address r2 are 13 (i.e., belong to the second range), a value of +2 (i.e., the second count value) may be counted up with respect to the row address r2, and a cumulative value of 3 may be stored in the count register 122c.

Referring to FIG. 16, in an embodiment, when the refresh enable signal EN_REF is received, the count comparator 122d may compare each of the pieces of count data CNT_data stored in the count register 122c with a reference value and may determine a row address corresponding to the count data CNT_data being the reference value or more to be the aggress address Agr_ADDR.

For example, when the refresh enable signal EN_REF is received, address r2 may be determined to be the aggress address Agr_ADDR. The aggress address Agr_ADDR that is output from the aggress address generator 122 may include address r2. The refresh address generator 123 may receive the aggress address Agr_ADDR to generate the refresh address REF_ADDR. In an embodiment, in the case where address r2 is included in the aggress address Agr_ADDR, the refresh address REF_ADDR may include address r1 and address r3 that are adjacent to address r2.

In the case where the refresh enable signal EN_REF is received, the row hammer handler 120 may be configured to perform the refresh operation on memory cell rows corresponding to the refresh address REF_ADDR.

According to an embodiment of the present disclosure, weights may be assigned to row addresses input to the access window 121a depending on the order of receiving the row addresses, and the row hammer handling operation may be performed based on the assigned weights. Accordingly, it may be possible to efficiently determine an aggress address. Also, it may be possible to reduce power consumption necessary in the row hammer handling operation, and the row hammer handling operation may be efficiently performed.

According to an embodiment of the present disclosure, there is provided a memory device that performs a row hammering operation with an improved electrical characteristic in a row hammer handling operation for preventing row hammering.

According to an embodiment of the present disclosure, there is provided a memory device that performs a row hammering operation performing method with an improved electrical characteristic in a row hammer handling operation for preventing row hammering.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A semiconductor memory device, comprising:
a memory cell array having a plurality of rows of memory cells therein; and
a row hammer handler configured to generate a refresh address when performing a refresh operation on the plurality rows of memory cells, said row hammer handler comprising:
a weight distributor configured to: receive a plurality of row addresses, assign a weight to each of the plurality of row addresses thus received, and to generate weight data corresponding to each of the plurality of row addresses;
an aggress address generator configured to determine an aggress address of a row of memory cells based on the weight data; and
a refresh address generator configured to receive the aggress address and to generate the refresh address, which includes address information of a memory cell row adjacent the aggress address;
wherein the weight assigned to each of the plurality of row addresses thus received has a value that varies relative to the order in which it is received; and
wherein the weight data associated with each of the plurality of row addresses is a function of at least one weight associated with its order of receipt and a frequency of its receipt over a predetermined time interval.

2. The device of claim 1,
wherein the weight distributor includes an access window and a weight table;
wherein the access window is configured to sequentially store the plurality of row addresses and to assign the weight to each of the plurality of row addresses thus stored; and
wherein the weight table is configured to store the weight assigned to each of the plurality of row addresses and to generate the weight data.

3. The device of claim 2, wherein the access window includes a plurality of sub-windows configured to store the plurality of row addresses; and wherein the plurality of sub-windows are configured to assign the weight to each of the plurality of row addresses stored therein.

4. The device of claim 1, wherein the weight assigned to each of the plurality of row addresses thus received has a value that varies inversely relative to the order in which it is received.

5. The device of claim 3,
wherein, at a first time, a first sub-window of the plurality of sub-windows stores a first row address of the plurality of row addresses;
wherein, at a second time, a second sub-window of the plurality of sub-windows stores the first row address, and the first sub-window stores a second row address of the plurality of row addresses;
wherein the first sub-window is configured to assign a first weight to the first row address at the first time and to assign the first weight to the second row address at the second time; and
wherein the second sub-window is configured to assign a second weight to the first row address at the second time.

6. The device of claim 5, wherein a value of the first weight that the first sub-window assigns is greater than a value of the second weight that the second sub-window assigns.

7. The device of claim 1,
wherein the aggress address generator includes a weight comparator configured to determine the aggress address;
wherein the weight comparator is configured to set a reference value and to determine a row address corresponding to the weight data being the reference value or more as the aggress address; and
wherein the aggress address generator is configured to generate the aggress address.

8. The device of claim 7, wherein the weight comparator is configured to determine the aggress address each time the plurality of row addresses are received.

9. The device of claim 7,
wherein the row hammer handler is configured to receive a refresh enable signal generated periodically; and
wherein, when the refresh enable signal is received, the weight comparator is configured to determine the aggress address.

10. The device of claim 1,
wherein the row hammer handler includes an address latch configured to store the refresh address;
wherein the address latch is configured to receive a refresh enable signal generated periodically; and
wherein, when the refresh enable signal is received, the address latch is configured to output the refresh address thus stored.

11. A method of performing a row hammer handling operation in a semiconductor memory device, comprising:
receiving a plurality of row addresses chronologically;
assigning weights to the plurality of row addresses respectively to thereby generate weight data from the assigned weights, which have values that vary relative to an order in which the plurality of row addresses are received chronologically;
determining an aggress address based on the weight data;
generating a refresh address including address information of an adjacent memory cell row close to an aggress memory cell row, based on the aggress address; and
performing a refresh operation on the adjacent memory cell row based on the refresh address.

12. The method of claim 11,
wherein the receiving of the plurality of row addresses chronologically includes:
receiving a first row address of the plurality of row addresses at a first time; and
receiving a second row address of the plurality of row addresses at a second time subsequent to the first time; and wherein assigning weights to the plurality of row addresses includes:
  generating the weight data by assigning a first weight to the first row address, at the first time; and
  generating the weight data by reassigning the first weight to the second row address and assigning a second weight to the first row address, at the second time.

13. The method of claim 12, wherein a value of the first weight is greater than a value of the second weight.

14. The method of claim 11, wherein determining the aggress address includes:
  generating the aggress address by determining a row address corresponding to the weight data being a reference value or more as the aggress address.

15. The method of claim 11, wherein determining the aggress address is performed every time during which the plurality of row addresses are received.

16. A method of performing a row hammer handling operation in an integrated circuit memory device, comprising:
  receiving a plurality of row addresses in sequence during a first time interval, said row addresses associated with corresponding rows of memory cells within the memory device;
  assigning a unique weight to each of the plurality of row addresses according to their order of receipt within the first time interval;
  generating respective weight data associated with each of the plurality of row addresses, which takes into account each row addresses unique weight(s) and a frequency of receipt of each row address within the first time interval;
  determining an aggress address of a row of memory cells within the memory device from the weight data; and
  generating a refresh address of at least one row of memory cells within the memory device from the aggress address.

17. The method of claim 16, wherein the plurality of row addresses includes at least a first row address that is received at an earlier point in time within the first time interval and has a lower assigned weight relative to a second row address that is received at a later point in time within the first time interval.

18. The method of claim 17, wherein the first row address is received at a first point in time within the first time interval, and also at a second point in time within the first time interval that is later than the first point in time; wherein the first row address is assigned a first weight and is also assigned a second weight greater than the first weight; and wherein the weight data associated with the first row address is equal to or greater than a sum of the first and second weights.

19. The method of claim 18, wherein said determining an aggress address of a row of memory cells within the memory device from the weight data comprises comparing the weight data associated with the first row address against a reference value to determine whether the first row address should be treated as an aggress address.

20. The method of claim 19, wherein said generating a refresh address of at least one row of memory cells within the memory device from the aggress address is followed by: (i) refreshing a first row of memory cells within the memory device that is associated with the first row address, and (ii) refreshing at least one row of memory cells within the memory device that extends immediately adjacent the first row of memory cells.

* * * * *